United States Patent
Yonezawa et al.

(10) Patent No.: US 6,809,308 B2
(45) Date of Patent: Oct. 26, 2004

(54) PHOTODETECTOR AND PHOTODETECTING SYSTEM CAPABLE OF DETECTING INFORMATION ABOUT THE TWO-DIMENSIONAL INTENSITY DISTRIBUTION AND WAVELENGTH DISTRIBUTION OF INCIDENT LIGHT

(75) Inventors: Minoru Yonezawa, Musashino (JP); Masatoshi Sakurai, Nerima-Ku (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/820,365

(22) Filed: Mar. 29, 2001

(65) Prior Publication Data

US 2001/0028026 A1 Oct. 11, 2001

(30) Foreign Application Priority Data

Mar. 30, 2000 (JP) .................................. 2000-095804

(51) Int. Cl.⁷ .............................................. H01L 31/00
(52) U.S. Cl. ............................... 250/214.1; 250/214 LS
(58) Field of Search .......................... 250/208.1, 214.1, 250/226, 208.2, 281, 431, 443, 457, 459, 214 LS, 82, 448, 449, 461

(56) References Cited

U.S. PATENT DOCUMENTS

| 3,935,441 | A | * | 1/1976 | Aldrich et al. ............ 250/214.1 |
|---|---|---|---|---|
| 4,447,720 | A | * | 5/1984 | Ogawa et al. ............... 257/443 |
| 4,677,289 | A | * | 6/1987 | Nozaki et al. ............... 250/226 |
| 4,724,338 | A | * | 2/1988 | Hoffmann et al. ........... 327/187 |
| 4,754,130 | A | * | 6/1988 | Kostenbauder ........... 250/214.1 |
| 4,820,915 | A | * | 4/1989 | Hamakawa et al. .......... 257/53 |
| 5,097,128 | A | * | 3/1992 | Jack ......................... 250/336.2 |
| 5,196,702 | A | * | 3/1993 | Tsuji et al. .................. 250/591 |
| 5,313,058 | A | * | 5/1994 | Friederich et al. ........ 250/214.1 |
| 5,351,209 | A | * | 9/1994 | Hayashi et al. .............. 365/112 |
| 5,608,666 | A | * | 3/1997 | Inushima et al. ............ 365/112 |
| 5,670,817 | A | * | 9/1997 | Robinson ..................... 257/443 |
| 6,278,055 | B1 | * | 8/2001 | Forrest et al. ................ 136/263 |
| 6,365,270 | B2 | * | 4/2002 | Forrest et al. ............... 428/336 |
| 6,373,117 | B1 | * | 4/2002 | Theil ........................... 257/444 |

* cited by examiner

*Primary Examiner*—Que T. Le
(74) *Attorney, Agent, or Firm*—Oblon, Spivak, McClelland, Maier & Neustadt, P.C.

(57) ABSTRACT

A photodetector which has the function of measuring the intensity distribution of light with a simple and inexpensive construction and which has a selectivity for a measured wavelength band. The photodetector includes a transparent semiconductor electrode part and counter electrode part on each of which a sensitizing dye is applied, and a buffer layer sandwiched therebetween. The counter electrode part or the transparent semiconductor electrode part is divided into a plurality of electrode cells. Thus, it is possible to realize a compact photodetector which carries out a photoelectric transfer using part of light in a wavelength band absorbed into the sensitizing dye and which has a wavelength selectively.

18 Claims, 30 Drawing Sheets

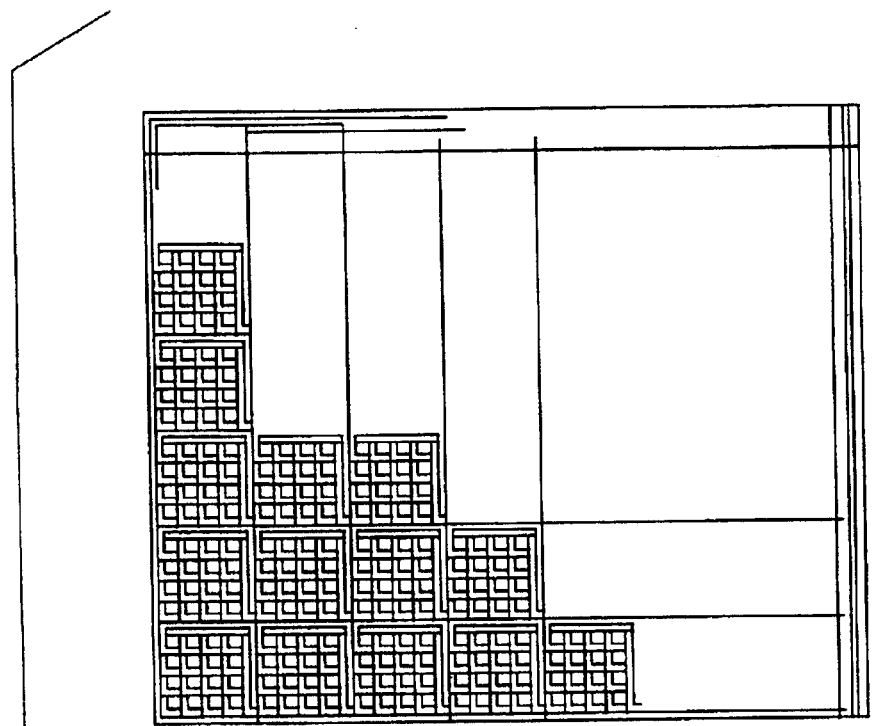
(a)
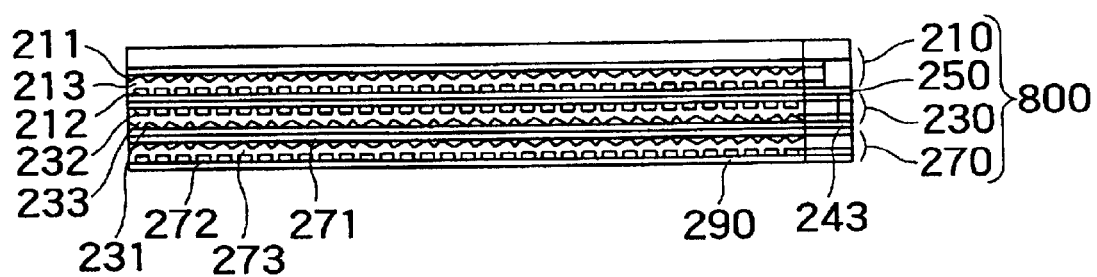
(b)
FIG. 26

PHOTODETECTOR AND PHOTODETECTING SYSTEM CAPABLE OF DETECTING INFORMATION ABOUT THE TWO-DIMENSIONAL INTENSITY DISTRIBUTION AND WAVELENGTH DISTRIBUTION OF INCIDENT LIGHT

CROSS REFERENCE TO RELATED APPLICATION

This application claims benefit of priority under 35 USC §119 to Japanese Patent Application No. 2000-95804, filed on Mar. 30, 2000, the contents of which are incorporated by reference herein.

BACKGROUND OF THE INVENTION

1. Field of the Invention

The present invention relates generally to a photodetector and a photo detecting system. More specifically, the invention relates to a photodetector and photo detecting system capable of detecting information about the two-dimensional intensity distribution and wavelength distribution of incident light by the improvement of a transmission photodetector.

2. Description of Related Art

Now that optical technology is applied to various systems, light receiving elements serving as light detecting means are applied as key devices in applications for all of light applied apparatuses. These light receiving elements are devices which are formed of a semiconductor and which generate an electromotive force by the effect of a p-n junction. The mechanism of the photoelectric transfer of a light receiving element will be briefly described below.

The mechanism of the photoelectric transfer is a mechanism wherein electrons and positive holes finally accumulate in an n-region and a p-region, respectively, to cause a potential difference although behavior is different in three places, i.e., in the vicinity of the surface, in a space charge region and within a crystal. First, light beams absorbed into the vicinity of the surface excite a high concentration of electrons and positive holes to cause the electrons and positive holes to diffuse toward the interior at which the concentrations of the electrons and positive holes are low. When the electrons and positive holes reach the space charge region of the p-n junction, the electrons drop in accordance with the potential gradient to reach the n-region, and the positive holes are blocked by the potential gradient to stay in the inlet of the space charge region.

Then, light beams absorbed into the p-n junction space charge region slightly inside of the surface produce electrons and positive holes there, and the electrons and positive holes move in accordance with the potential gradient to accumulate in the n-region and p-region. Finally, only the long-wavelength components of light beams reach the interior of the crystal, and the positive holes produced in the inside n-region reach the space charge region by diffusion to be collected in a p-region by the electric field. Thus, the electromotive force is generated on both sides of the p-n junction when the p-n junction is irradiated with light.

Conventional light receiving elements are generally arranged at the end of an optical path as shown in, e.g., FIG. 35, since light beams do not pass through the surface forming p-n junction. That is, in FIG. 35, light beams which are split by a beam splitter 2 provided in an optical path 1 are led to a light receiving element 3. Therefore, the detecting optical system having the light receiving element 3 often has a complicated construction. In addition, by providing the beam splitter 2, it is not possible to avoid shifting the optical axis and generating noises on the wave front of beams to have a bad influence. Therefore, particularly in measuring systems requiring to propagate beams at a long distance, there is a problem in that it is difficult to adapt such a detecting optical system.

On the other hand, with the advance of optical applied system in recent years, it is increasingly requested to propagate light beams of a plurality of wavelength on the same optical axis. Conventionally, systems for dispersing light beams using a half mirror or a polarized beam splitter taking account of the polarized state are often used for detecting light beams having a single wavelength such as laser beams. However, with the development of recent short-wavelength lasers, there are many examples where lasers of a plurality of wavelengths have the same optical axis. In an optical disc system serving as one of the examples, two lasers having different wavelengths of 780 nm and 635 nm are used for reading a compact disc (CD) and a digital versatile disc (such as DVD) by the same system. In the current technology, detecting systems for the two wavelengths are often separately constructed, so that it is considered that the construction of the detecting optical system is increasingly complicated with the advance of optical technology.

As one of examples where incident light has a wide frequency band, there is an image sensor. As a typical example, there is a charge coupled device (CCD) for video camera or the like wherein natural light is incident thereon. The image sensor for video camera is provided with an optical system having three CCDS, as shown in FIG. 36, for dividing incident light beams into three kinds of wavelength bands of RGB to detect the divided light beams, respectively. That is, in the construction shown in this figure, a red component is separated by a prism 5, which is arranged in an optical path 1, to be detected by a CCD 4A. In addition, a green component separated by a prism 6 is detected by a CCD 4B, and a blue component separated by a prism 7 is detected by a CCD 4C. By adapting this detecting optical system, a light-intensity signal detected after the separation into primary colors is extracted as an information signal. In order to realize a high performance image sensor, it is required to separate incident light of such a wide wavelength band into light beams of primary colors to provide detecting systems for the respective primary colors, and it is indispensable to provide the complicated detecting system shown in FIG. 36.

In order to simplify the above described detecting optical system, a photodetector for partially transmitting light beams is proposed. As conventional photodetectors having light transmitting functions, there are reverse transparent electrode optical sensors which are mainly used for a solar battery and which are provided with an amorphous silicon optical sensor on a glass substrate, and see-through optical sensors for allowing the transmission of light beams by forming a micropore in silicon.

However, in the reverse transparent electrode optical sensors, color is limited to the band gap of silicon. Therefore, colors other than red, e.g., blue and green, can not be absorbed so that the wavelength band is limited. In addition, since the see-through optical sensors allow the micropore to transmit light beams, it is not possible to enhance both of transmittance and conversion efficiency, and it is not possible to adjust absorption wavelength.

In addition, as shown in FIG. 37, a transmission photodetector is realized by producing a thin-film photodiode using a process for controlled-thinning a silicon substrate.

That is, in the example shown in this figure, a silicon oxide mask M is utilized for controlled-thinning a part of a silicon substrate S by etching with TMAH (Tetra-Methyl-Ammonium-Hydroxide) (see FIG. 37(a)), a p-n junction is formed (see FIG. 37(b)), and electrodes E are formed to form a thin-film photodiode (see FIG. 37(c)).

However, in such a detector, there are problems in that the production costs are high and the light transmittance is low. In addition, since the spectra of wavelengths of light beams absorbed and detected are fixed due to silicon serving as the material, there is a problem in that the use as a photodetector is very limited.

As described above, the conventional photodetector having the light receiving element must be arranged at the end of the optical path since it can not transmit light beams. Simultaneously, there are problems in that it is indispensable to disperse light beams by providing the beam splitter or the like in the optical path in order to lead light beams to the photodetector arranged at the end, that the construction of the optical system is complicated, that the optical axis is finely shifted, and that noises are generated on the wave front of beams.

With the advance of optical technology in recent years, if detecting optical systems, the number of which corresponds to the number of used wavelengths, are provided due to the use of lasers of a plurality of wavelengths and/or the use of the frequency band which is split to be detected, the detecting optical systems tend to be increasingly complicated.

In addition, although there are conventionally light transmitting detectors having limited uses, fine adjustment is difficult and the production costs are high, so that these detectors are not suitably used as inexpensive and high performance photodetectors.

SUMMARY OF THE INVENTION

It is therefore an object of the present invention to eliminate the aforementioned problems and to provide a photodetector, which is inexpensive and has a simple construction and excellent productivity, for carrying out a photo detection capable of selecting a wavelength band.

In order to accomplish the aforementioned and other objects, according to a first aspect of the present invention, a transmission photodetector comprises a first transparent electrode, a second transparent electrode, and a photoelectric transfer part sandwiched between the first and second transparent electrodes, wherein at least one of the first and second transparent electrodes is divided into a plurality of electrode cells, and the photoelectric transfer part is common to the plurality of electrode cells.

In this transmission photodetector, the photoelectric transfer part may comprise: a transparent semiconductor layer stacked on the first transparent electrode; a sensitizing dye film, stacked on the transparent semiconductor layer, absorbing light in a wavelength band including a predetermined wavelength; and a carrier transporting layer sandwiched between the sensitizing dye film and the second transparent electrode.

Alternatively, the photoelectric transfer part may comprise: a transparent semiconductor layer stacked on the first transparent electrode; a sensitizing dye film, stacked on the transparent semiconductor layer, absorbing light in a wavelength band including a predetermined wavelength; and a dielectric layer sandwiched between the sensitizing dye film and the second transparent electrode.

Alternatively, the photoelectric transfer part may comprise an organic p-type semiconductor layer stacked on the first transparent electrode, and an organic n-type semiconductor layer stacked on the organic p-type semiconductor layer, wherein the second transparent electrode is stacked on the organic n-type semiconductor layer.

According to a second aspect of the present invention, a transmission photodetector comprises: a first transparent electrode; a transparent semiconductor layer stacked on the first transparent electrode; a sensitizing dye film, stacked on the transparent semiconductor layer, absorbing light in a wavelength band including a predetermined wavelength; a second transparent electrode; and a carrier transporting layer sandwiched between the sensitizing dye film and the second transparent electrode, wherein at least one of the first and second transparent electrodes is divided into a plurality of electrode cells.

According to a third aspect of the present invention, a transmission photodetector comprises: a first transparent electrode; a transparent semiconductor layer stacked on the first transparent electrode; a sensitizing dye film, stacked on the transparent semiconductor layer, absorbing light in a wavelength band including a predetermined wavelength; a second transparent electrode; and a dielectric layer sandwiched between the sensitizing dye film and the second transparent electrode, wherein at least one of the first and second transparent electrodes is divided into a plurality of electrode cells.

According to a fourth aspect of the present invention, a transmission photodetector comprises: a first transparent electrode; an organic p-type semiconductor layer stacked on the first transparent electrode; an organic n-type semiconductor layer stacked on the organic p-type semiconductor layer; and a second transparent electrode stacked on the organic n-type semiconductor layer, wherein at least one of the first and second transparent electrodes is divided into a plurality of electrode cells.

According to a fifth aspect of the present invention, a stacked type photodetector comprises: a first transmission photodetector configured to carry out a photoelectric transfer with respect to light in a first wavelength band including a predetermined wavelength; and a second photodetector, stacked on the first transmission photodetector, configured to detect light passing through the first transmission photodetector.

In this stacked type photodetector, the first transmission photodetector may comprise: a first transparent electrode; a transparent semiconductor layer stacked on the first transparent electrode; a sensitizing dye film stacked on the transparent semiconductor layer; a second transparent electrode; and a carrier transporting layer sandwiched between the sensitizing dye film and the second transparent electrode.

Alternatively, the first transmission photodetector may comprise: a first transparent electrode; a transparent semiconductor layer stacked on the first transparent electrode; a sensitizing dye film stacked on the transparent semiconductor layer; a second transparent electrode; and a dielectric layer sandwiched between the sensitizing dye film and the second transparent electrode.

Alternatively, the first transmission photodetector may comprise: a first transmission electrode; an organic p-type semiconductor layer stacked on the first transparent electrode; an organic n-type semiconductor layer stacked on the organic p-type semiconductor layer; and second transparent electrode stacked on the organic n-type semiconductor layer.

In the above described stacked type photodetector, the second photodetector may have a transparent electrode, at least one of the first or second transparent electrode of the first photodetector and the transparent electrode of the second photodetector being divided into a plurality of electrode cells.

The second photodetector may have a third transparent electrode stacked on one principal plane of a transparent substrate, the second transparent electrode of the first transmission photodetector being stacked on the other principal plane of the transparent substrate.

In this case, each of the second and third transparent electrodes may be divided into a plurality of electrode cells, the plurality of electrode cells of the second transparent electrode being the same dividing patterns as those of the third transparent electrode.

The plurality of electrode cells may have substantially equal areas symmetrically with respect to a point on the optical axis of incident light.

The second photodetector may have a fourth transparent electrode provided so as to face the third transparent electrode, each of the first and fourth transparent electrodes having a constant potential during operation.

The stacked type photodetector may further comprise a signal processor, integrally provided with the photodetector, configured to process circuit processing an electric signal every one of the divided electrode cells, the electric signal being obtained via each of the second and third transparent electrodes.

In the stacked type photodetector, a second wave length band photoelectric-transferred by the second photodetector may include a longer wavelength component than that of the first wavelength band photoelectric-transferred by the first transmission photodetector.

With the above described construction, according to the present invention, there is realized a photodetector selectively detecting a predetermined wavelength component while transmitting light. This photodetector can very simply form a detecting optical system.

Since this photodetector can be produced by an inexpensive and simple producing process, it is possible to provide a high-performance optical detecting system at low costs. Since this photodetector can have a wavelength selectivity, only a predetermined wavelength component can also be detected in an optical system wherein laser beams of a plurality of wavelengths are arranged on the same optical axis.

Such a transmission photodetector can also receive light from both surfaces, so that it is possible to provide a detecting optical system capable of being applied to the detection of various position shifts.

If photo detecting units for selecting a wavelength to carry out a detection are stacked, the sensitivity of detection can be improved. If the selecting wavelengths of the stacked type photo detecting units are set to be different from each other, it is possible to provide a photodetector capable of simultaneously detecting light beams of a plurality of wavelengths.

One feature of the structure of this photodetector is that the photodetector has divided electrodes. Since these electrodes are formed on both surfaces of the same transparent substrate, the divided electrodes can be easily aligned with each other. With such a construction of the stacked type photodetector, it is possible to simplify the producing process, and it is possible to realize an inexpensive photodetector.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 11 is a conceptual drawing showing an example where the transmission photodetector in the second preferred embodiment is arranged in a detecting optical system for use in a video camera or the like;

FIG. 26(a) is a plane view showing the appearance of the eighth preferred embodiment of a stacked type transmission photodetector according to the present invention, and FIG. 26(b) is a sectional view of a principal part thereof;

DESCRIPTION OF THE PREFERRED EMBODIMENTS

Referring now to the accompanying drawings, the preferred embodiments of the present invention will be described below in detail.

Figure 1A:
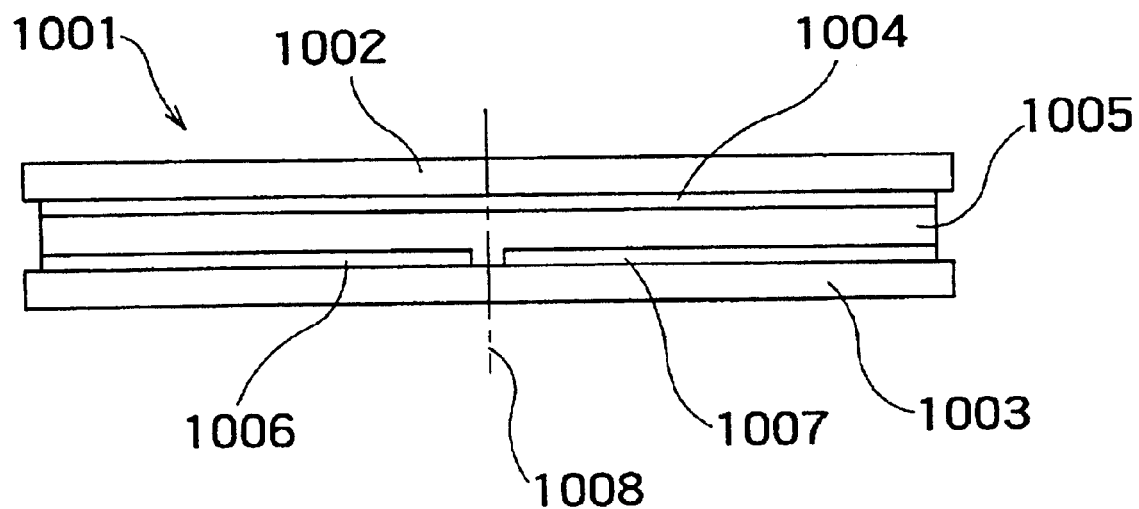
FIG. 1A is a schematic sectional view showing an example of the basic construction of a photodetector according to the present invention.

First Preferred Embodiment: Transmission Photodetector With Electrode Divided Into Four Parts FIG. 1A is a schematic sectional view showing an example of a basic construction of a preferred embodiment of a photodetector according to the present invention. That is, a photodetector 1001 comprises a first electrode part 1004 formed on a transparent substrate 1002, a second electrode part which is formed on a transparent substrate 1003 and which comprises two divided first and second electrode cells 1006 and 1007, and a photoelectric transfer part 1005 sandwiched between both electrode parts.

Light beams entering the transparent substrate 1002 pass through the transparent substrate 1002 and the first electrode part 1004 to cause the movement of electrons and positive holes in the photoelectric transfer part 1005. As a result, the electromotive force due to the movement of electrons and positive holes in the vicinity of the first electrode cell 1006 of the divided second electrode part is generated between the first electrode part 1004 and the first electrode cell 1006, and the electromotive force in the vicinity of the other second electrode cell 1007 is generated between the first electrode part 1004 and the second electrode cell 1007.

Thus, by dividing the second electrode part into two or more electrode cells, the electromotive forces depending on the intensities of light beams entering the regions divided by a dividing line can be separately extracted.

In conventional divided type photodetectors, portions corresponding to the photoelectric transfer part 1005 and first electrode part 1004 of the photodetector according to the present invention are also divided, so that it is difficult to detect light beams entering an intermediate region between the divided regions. In the photodetector divided into two parts as shown in FIG. 1A as an example, the area of the intermediate region is very small, whereas in a photodetector divided into a large number of regions, the components of the electromotive force which should be generated in the intermediate regions are large to consequently cause the lowering of the photoelectric transfer efficiency.

On the other hand, according to the present invention, there is provided an efficient photodetector which can also carry out the photoelectric transfer with respect to the intermediate regions between the divided regions. In addition, it is possible to provide a photodetector wherein a portion to be divided may be only the second transparent electrode part and which can be easily formed by patterning or the like.

With the above described construction, the operation of a transmission photodetector in this preferred embodiment will be described below.

Figure 1B:
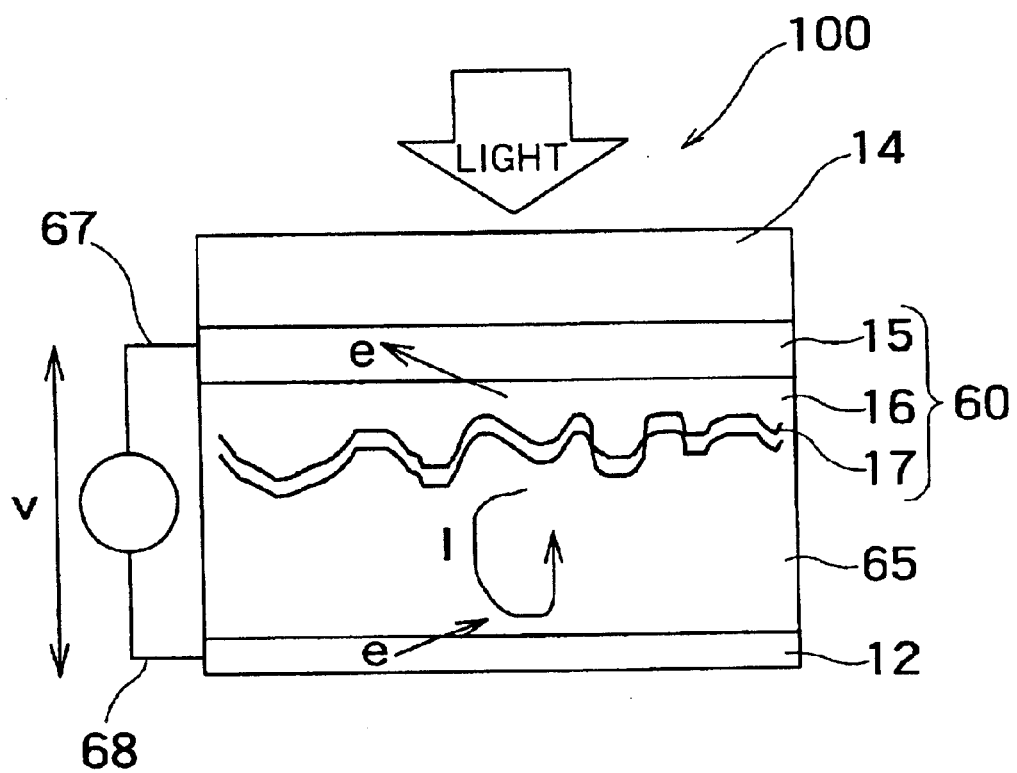
FIG. 1B is a conceptual drawing showing an operation model of a photodetector according to the present invention.

FIG. 1B is a conceptual drawing showing an operation model of a photodetector according to the present invention. Light beams entering a transmission photodetector 100 reach a dye sensitizing transparent semiconductor electrode part 60 via a transparent substrate 14. Light beams in the absorption wavelength region of a sensitizing dye film 17 are herein absorbed to excite the sensitizing dye film 17. By this excitation, positive holes are generated at the highest occupied molecular orbital (HOMO) level of the sensitizing dye film, and electrons are generated at the lowest unoccupied molecular orbital (LUMO) of the sensitizing dye film to move to a transparent semiconductor layer 16 of titanium oxide ($TiO_2$) or the like.

Furthermore, as an energy level required to operate the above described photodetector, the LUMO level of each of the sensitizing dye film is preferably higher than the conductive band level of the transparent semiconductor layer by 0.5 eV or less.

In a buffer layer 65 of an oxidation-reduction electrolyte which is a carrier transporting substance, positive holes generated at the HOMO level of the sensitizing dye film 17 move to the buffer layer 65, and positive holes move to a counter electrode part 12 through the buffer layer 65 to enter the counter electrode. On the other hand, electrons reaching the transparent semiconductor layer 16 move to a transparent electrode 15. The electrons in this transparent electrode move to a wire 67, and positive holes in the counter electrode 12 move a wire 68, so that the transmission photodetector according to the present invention is operated by the current flowing through the wires 67 and 68.

Figure 2A:
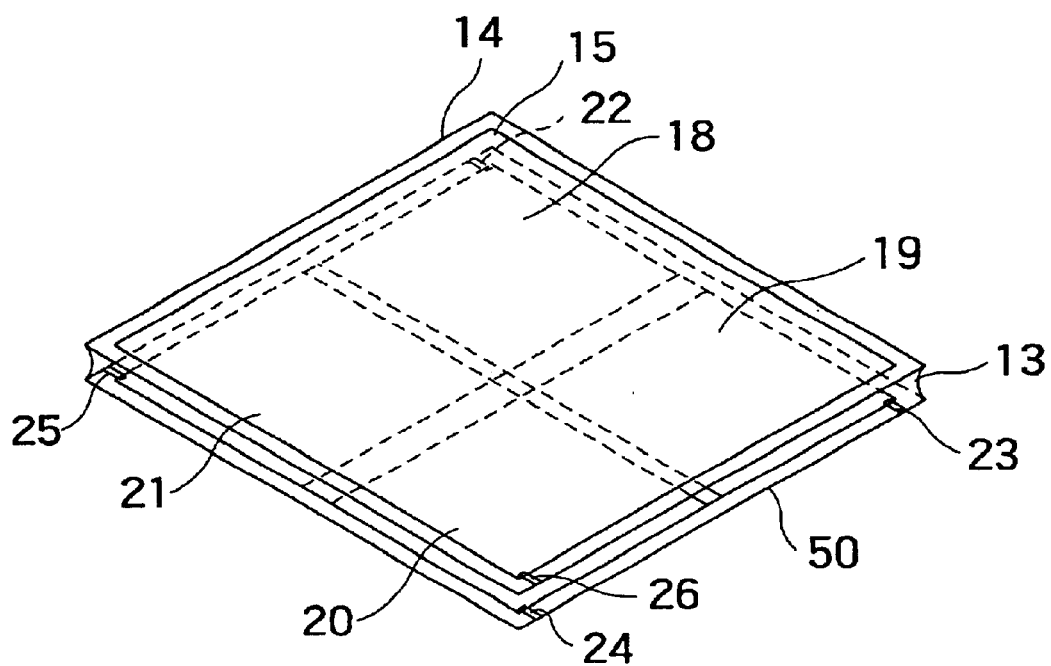
FIG. 2A is a perspective view showing the appearance of the first preferred embodiment of a transmission photodetector according to the present invention.
Figure 2B:
FIG. 2B is a sectional view of the transmission photodetector in the first preferred embodiment.

FIGS. 2A and 2B show the appearance of the first preferred embodiment of a transmission photodetector according to the present invention. FIG. 2A is a perspective view of the appearance thereof, and FIG. 2B is a sectional view thereof.

This photodetector 100 is a transmission photodetector for selectively absorbing light beams having a predetermined wavelength band to carry out a photoelectric transfer. This transmission photodetector comprises a dye sensitizing transparent semiconductor electrode part 11, a counter electrode part 12, and a buffer layer 13 sandwiched between both electrode parts. The dye sensitizing transparent semiconductor electrode part 11 comprises a transparent electrode 15 and transparent semiconductor layer 16 which are formed on a transparent substrate 14, and a sensitizing dye film 17 absorbed into the semiconductor layer 16.

The counter electrode part 12 comprises a transparent electrode formed on a transparent substrate 50. As shown in the figure, this transparent electrode is divided into four cells 18, 19, 20 and 21 which are electrically isolated from each other, and wires 22, 23, 24 and 25 are arranged so as to be able to separately extract current signals which are generated in the respective electrode cells.

While the counter electrode part 12 has been divided into the four cells having equal areas in the example shown in FIGS. 2A and 2B, the electrode part 12 may be divided into a plurality of linear cells or a large number of cells in the form of a matrix. The respective transparent electrodes and electrode parts are divided symmetrically with respect to a point on the center of the optical axis of incident light.

When the photodetector is applied to a power monitor for detecting the quantity of incident light, it is not required to divide the electrode part.

Also with respect to the electrode cells 18, 19, 20 and 21 shown in FIGS. 2A and 2B, the principle of operation is the same. On the basis of this principle of operation, a current flows through the wiring corresponding to each of the cells in proportion to the quantity of light, with which each of the cells is irradiated. In order to obtain high quality signals, the potential level of the transparent electrode 15 should be the ground level. In this case, positive potentials are generated in the plurality of counter electrode cells to detect a voltage corresponding to each of the cells by the current-voltage conversion. That is, the wire 26 of the transparent electrode 15 is grounded.

An applied example of the transmission photodetector 100 with the above described construction will be described below.

Figure 3:
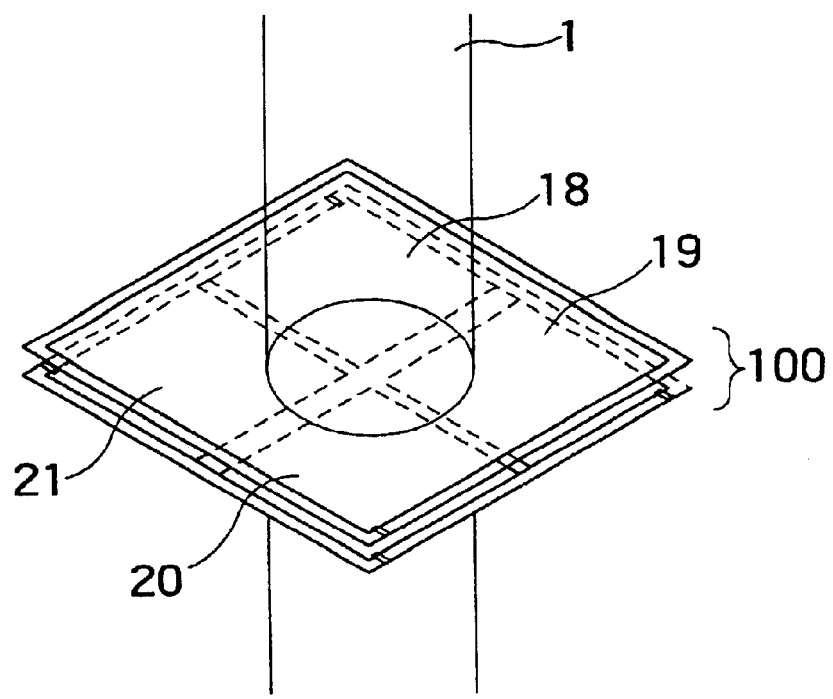
FIG. 3 is a conceptual drawing showing an applied example of a transmission photodetector according to the present invention.

FIG. 3 is a conceptual drawing showing an applied example of a transmission photodetector according to the present invention.

If the transmission photodetector 100 in this preferred embodiment is arranged in an optical path 1 as shown in this figure, a simple detecting optical system can be formed. By the detecting optical system shown in this figure, the outputs of divided electrode cells 18, 19, 20 and 21 can be compared with each other to calculate the quantity of position shift of the photodetector from a reference beam or the quantity of position shift of the optical axis from the photodetector.

Light beams passing through the transmission photodetector can be utilized for another use.

Figure 4:
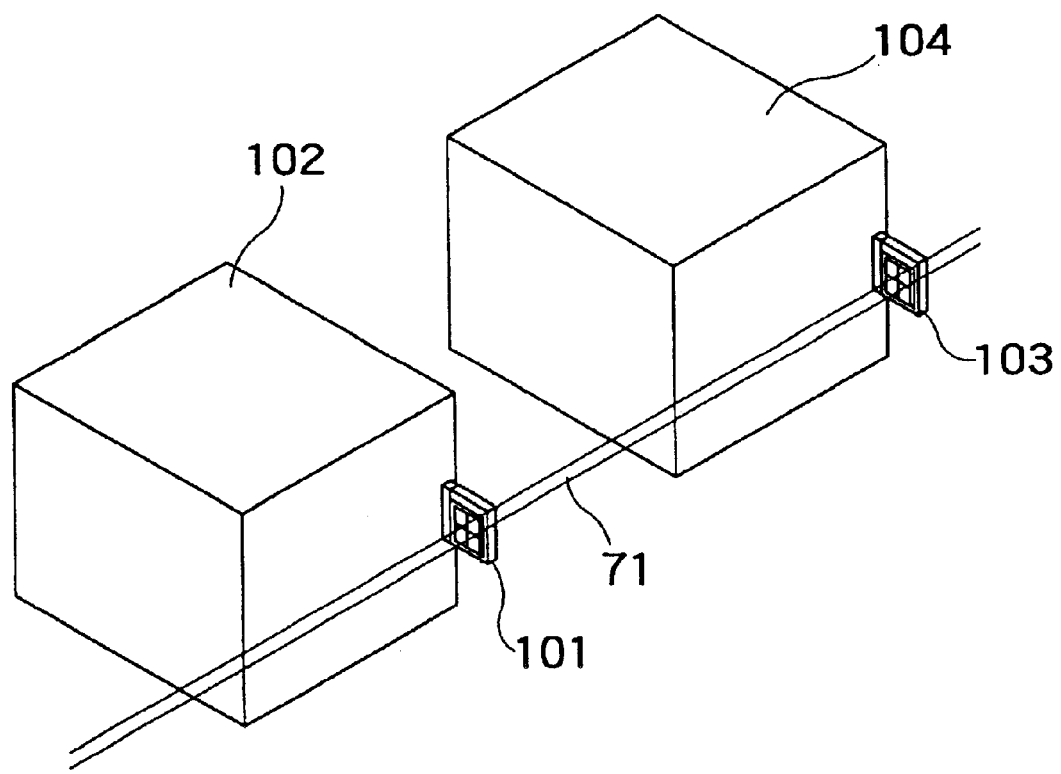
FIG. 4 is a conceptual drawing showing an example where transmitted light passing through a photodetector 100 is also utilized for detecting a position shift.

FIG. 4 is a conceptual drawing showing an example where transmitted light passing through photodetectors 101 and 103 are also utilized for detecting a position shift. By using the plurality of transmission photodetectors 101 and 103 according to the present invention as shown in this figure, it is possible to form a detecting optical system for detecting a position shift between a plurality of moving structural bodies on the basis of a reference beam 71.

In this case, the distance between the structural bodies 102 and 104 may be 1 m or more. When light beams of a plurality of wavelength bands are incident on then optical axis shown in FIG. 4, the transmission photodetectors 101 and 103 provided for the respective structural bodies may be produced by using sensitizing dyes of different compositions. In this case, the position shift of a first structural body with respect to a light beam of a first wavelength band is detected by a first photodetector, and the position shift of a second structural body with respect to a light beam of a second wavelength band.

In the preferred embodiment shown in FIGS. 3 and 4, the position shift of the optical axis of incident light from the center of the photodetector can be two-dimensionally detected by detecting the output signals of the four divided electrode cells 18, 19, 20 and 21 as the quantities of incident light on the corresponding cells and by carrying out a comparison operation, specifically an addition/subtraction operation. When signals obtained by the respective electrode cells are thus used for carrying out a signal processing, a signal processing circuit is preferably provided so as to be very close to the photodetector in order to detect and process a very weak current with a high S/N.

Figure 5:
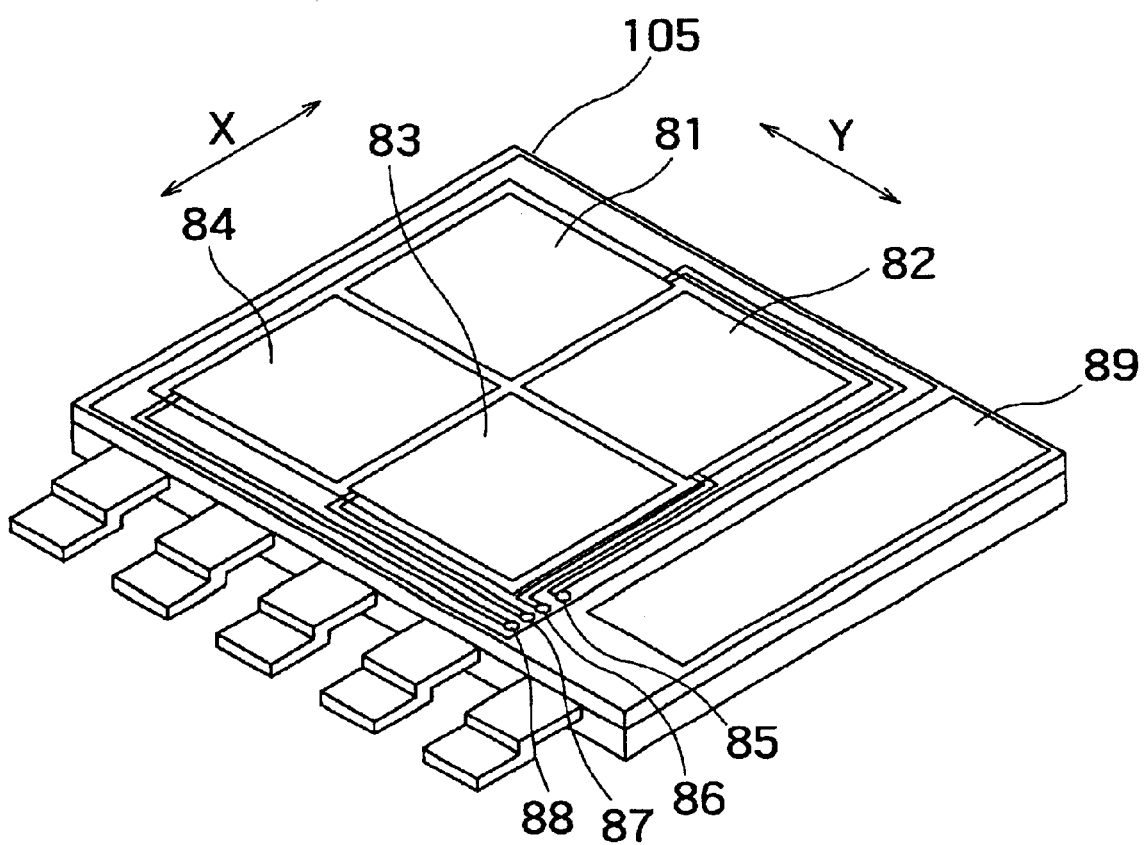
FIG. 5 is a conceptual drawing showing an example of a transmission photodetector having an electrode cell divided into four parts.

FIG. 5 is a conceptual drawing showing an example of a transmission photodetector having four divided electrode cells. In this figure, signals of electrode cells 81, 82, 83 and 84 detected by a transmission photodetector 105 are inputted to a signal processing circuit 89 via wires 85, 86, 87 and 88. In this signal processing circuit 89, the addition and subtraction with respect to the respective signals are carried out. For example, if signals inputted from the wires 85 and 86 are added to be subtracted from the sum of signals inputted from the wires 87 and 88, the quantity of position shift of the optical axis of incident light in X directions can be detected. Similarly, the quantity of position shift in Y directions can also be detected by an addition/subtraction operation, so that the shift of the optical axes in two directions of X and Y axes can be detected. This quantity of position shift has the same meaning as that of the quantity of position shift of the photodetector with respect to the reference beam.

With respect to the transmission photodetector shown in FIG. 1B, the carrier transporting substance of the oxidation-reduction electrolyte has been used as the buffer layer 65. In this case, a current flows between the electrodes while light beams are incident thereon, and no current flows while no light beams are incident thereon.

On the other hand, the buffer layer 65 may be formed of a dielectric. In this case, the principle of operation of the photodetector is slightly different, and detected signals have different characteristics with respect to incident light.

Figure 6:
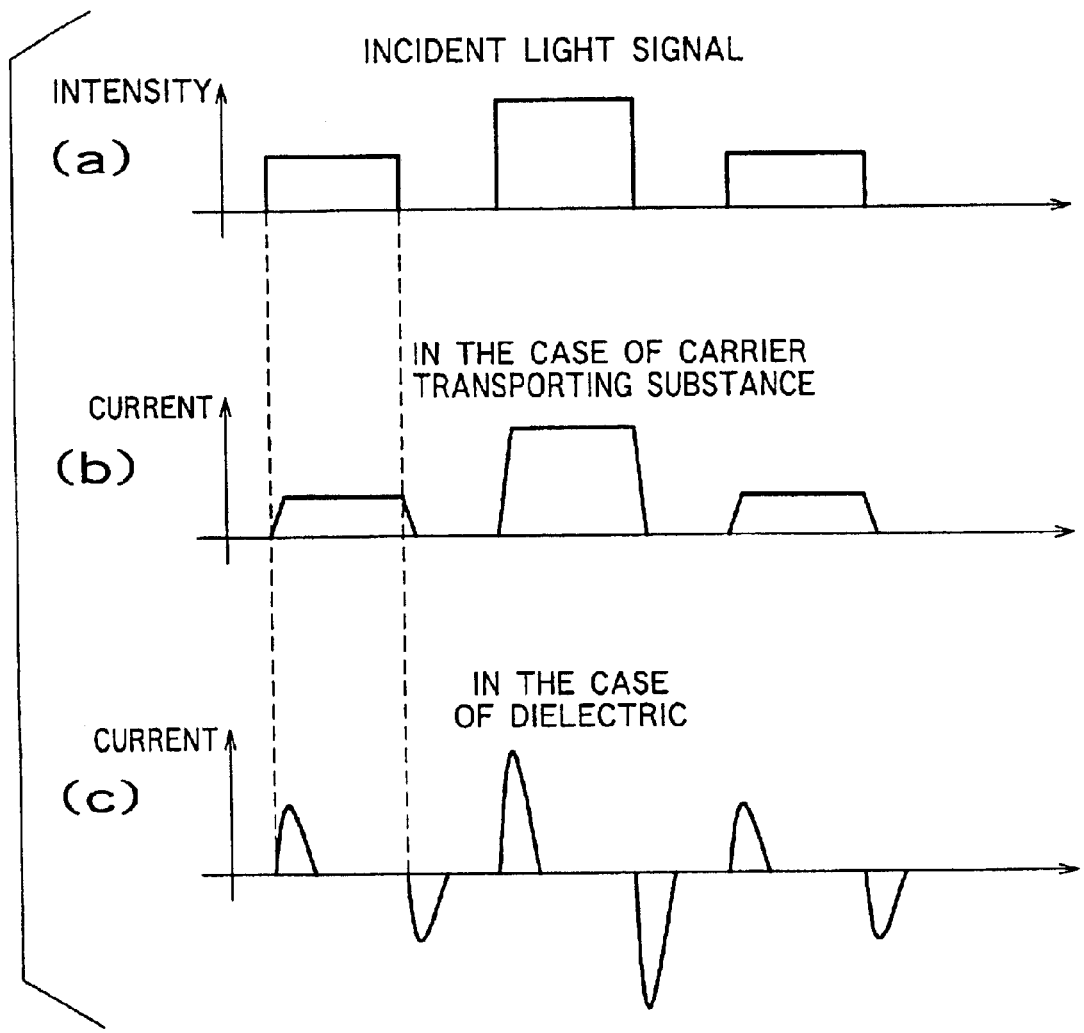
FIG. 6 is a graph showing the difference between the current signals of a carrier transporting substance and a dielectric.

FIG. 6 is a graph showing this difference in current signal.

When the buffer layer is formed of a carrier transporting substance, a current signal shown in FIG. 6(*b*) flows with respect to incident light signal shown in FIG. 6(*a*).

On the other hand, when the buffer layer is formed of a dielectric, an electric field is generated in a transmission optical sensor unit by the above described movement of charges, so that a displacement current flows through a wire. By the function of this displacement current, positive charges are generated in the transparent electrode, and negative charges are generated in the counter electrode. At this time, the transmission photodetector according to the present invention is operated by detecting the displacement current flowing between the wires.

That is, since the displacement current flows as a time differentiated value of the quantity of incident light, a positive pulse is generated between the electrodes as shown in FIG. 6(c) simultaneously with the incidence of light shown in FIG. 6(a). In addition, no current flows during irradiation with light, and a negative pulse current flows simultaneously with the disappearance of light.

The speed of response of the photodetector will be described below. That is, the light absorption of the sensitizing dye film 17 in each of the transmission photo detecting units and the electron transition to the transparent semiconductor layer 16 occur in femtoseconds, and electrons transferred to the transparent semiconductor layer 16 return to the sensitizing dye film 17 in nanoseconds. If the carrier transporting substance is used as the buffer layer 65, the movement of positive holes from the sensitizing dye film 17 to the carrier transporting substance 65 occurs to fill the HOMO level of the sensitizing dye film 17 with positive holes, in picoseconds after the movement of electrons from the sensitizing dye film 17 to the transparent semiconductor film 16. Therefore, the return of electrons from the transparent semiconductor layer 16 to the sensitizing dye film 17 is difficult to occurs since the return of electrons occurs in nanoseconds which is slower than the movement of the movement of positive holes.

The speed of response of the transmission photo detecting unit is determined by a speed at which the positive holes moved from the sensitizing dye film 17 diffuse in the carrier transporting substance 65. For example, if an electrolyte utilizing ion diffusion is used as the carrier transporting substance 65, the ion diffusion rate is usually slow, so that the unit is difficult to response to signals in MHz.

If a dielectric, not a carrier transporting substance, is used as the buffer layer 65, positive holes at the HOMO level of the sensitizing dye film 17 produced by light absorption do not move, so that the movement of electrons from the transparent semiconductor layer 16 occurs in nanoseconds. Therefore, the speed of response of the unit is higher than that when the carrier transporting substance is used, so that it is possible to response to signals in tens MHz.

The respective members of the transmission photodetector according to the present invention will be described below.

The transparent electrode 11 for use in the present invention means a construction wherein the transparent electrode 15 of a transparent conductive layer is provided on the surface of the transparent substrate 14.

The transparent substance 14 may be formed of any one transparent plate materials, e.g., a glass or a polymer film.

The transparent electrode 15 may be formed of any one of transparent materials having conductivity on the surface of the electrode. For example, the transparent electrode 15 is preferably formed of tin oxide doped with fluorine, indium or aluminum, or zinc oxide. A very small amount of a non-transparent electrode layer, such as platinum, gold, silver, copper or aluminum, may be included if it does not so obstruct the transmission of light. The transparent electrode 15 may be divided into a plurality of patterns on the transparent substrate. In this case, wires are mounted so as to extract signals from the respective cells to the outside of the cell, respectively.

The auxiliary electrode (wire) is preferably formed of a non-transparent metal, such as platinum, gold, silver, copper or aluminum, or a material having a high conductivity, such as graphite.

The transparent semiconductor layer 16 is preferably formed of a semiconductor which absorbs a small quantity of light in a visible light region. As preferred metal oxide semiconductors, there are oxides of transition metals, such as oxides of titanium, zirconium, hafnium, strontium, zinc, indium, yttrium, lanthanum, vanadium, niobium, tantalum, chromium, molybdenum and tungsten, combined oxides thereof, and mixtures of the oxides. Specifically, there are perovskites, such as $SrTiO_3$, $CaTiO_3$, $BaTiO_3$, $MgTiO_3$ and $SrNb_2O_6$, combined oxides thereof, and mixture of the oxides, such as GaN.

The absorption of the sensitizing dye layer 17 onto the surface of the transparent semiconductor layer 16 does not occur so that thickness of the absorbed sensitizing dye layer 17 exceeds the thickness of one molecular layer to a few molecular layers. In order to control the apparent shade of color of elements, fine irregularities can be formed on the surface of the transparent semiconductor layer 16 as shown in FIG. 1B to control the effective surface area. In order to form a structure of irregularities, a fine grain structure may be used. For example, when a sintered body of fine particles of $TiO_2$ having a grain size of 10 nm is used for preparing a fine structure, the effective surface area can be controlled by adjusting the thickness of the fine grain layer. The structure of irregularities is preferably formed so that the whole specific surface area is in the range of from 100 to 1000.

The transparent electrode and transparent semiconductor layer have properties for transmitting light beams of a wavelength region of visible light, and transmit at least 30%, preferably 50%, more preferably 70% or more, of light beams having a wavelength of 300 nm to 800 nm.

The sensitizing dye layer 17 absorbs incident light to be in an excited state. Thereafter, the sensitizing dye layer 17 transfers electrons to the transparent semiconductor layer, and then, receives electrons from a solid carrier transporting substance. Therefore, the LUMO level of the sensitizing dye film 17 must be equal to or higher than the conductive band level of the transparent semiconductor layer 16. In order to cause the sensitizing dye film 17 to be strongly absorbed onto the surface of the transparent semiconductor layer 16, the sensitizing dye film 17 preferably has a functional group, such as carboxyl group, hydroxyalkyl group, hydroxyl group, sulfonic group or carboxyalkyl group, in its molecule.

The sensitizing dye film 17 preferably has a structure which has the above described functional group in any one of ruthenium-tris, ruthenium-bis, osmium-tris and osmium-bis type transition metal complexes, multinuclear complexes, ruthenium-cis-diaqua-bipyridyl complexes, phthalocyanine dyes, porphyrin dyes, perylene dyes, anthraquinone dyes, azo dyes, quinophthalone dyes, naphthoquinone dyes, cyanine dyes and merocyanine dye. In order to obtain a desired color, a mixture of these dyes may be used.

As the dielectric material forming the buffer layer 65, any one of crystalline or amorphous organic molecules may be used. The crystalline organic molecules include various kinds of metal phthalocyanines, perylene tetracarboxylic acid, polynuclear aromatic compounds such as perylene and coronene, tetrathiafulvalene, charge-transfer complexes such as tetracyanoquinodimethane, amorphous materials such as Alq3, diamines, various kinds of oxadiazoles, conductive macromolecules such as polypyrroles, polyanilines, poly-N-vinylcarbazoles and polyphenylene-vinylenes.

As the carrier transporting substance forming the buffer layer 65, any one of ion transport materials and electron/hole transport materials may be used. The ion transport materials include salts, such as iodine ion containing salts, sulfonimide salts, alkylimidazolium salts, tetracyanoquinodimethane salts and dicyanoquinodiimine salts. The ion transport materials are preferably liquid ion transport materials which are selected from acetonitrile, ethylene carbonate, propylene carbonate and mixtures thereof, and gel ion transport materials which are formed by mixing any one of host polymers, such as polyethylene oxides, polyacrylonitriles, polyvinylidene fluorides, polyvinylalcohols, polyacrylic acids and polyacrylic amides, in any one of the above described liquid ion transport materials to polymerize the mixture.

At the electron/hole transport materials, crystalline or amorphous organic molecules may be used. The crystalline organic molecules include polynuclear aromatic compounds such as perylene and coronene, various kinds of metal phthalocyanines, perylene tetracarboxylic acid, tetrathiafulvalene, charge-transfer complexes such as tetracyanoquinodimethane, amorphous materials, aluminum quinodimethane, diamines, oxadiazoles, polypyrroles, polyanilines, poly-N-vinylcarbazoles and polyphenylene-vinylenes.

The ion transport material used in this preferred embodiment is an acetonitrile/ethylene carbonate mixture solvent electrolyte solution comprising about 0.5 mol/l of tetrapropylammonium iodine, about 0.02 mol/l of potassium iodine, and 0.03 mol/l of iodine.

If the photodetector in this preferred embodiment comprises the above described members, the thickness of the transparent substrate can be thinned to be about 0.1 mm, and the thickness of other elements is negligible, so that the whole thickness can be about 0.5 mm.

The point of a method for preparing a transmission photodetector according to the present invention will be described below.

Figure 7:
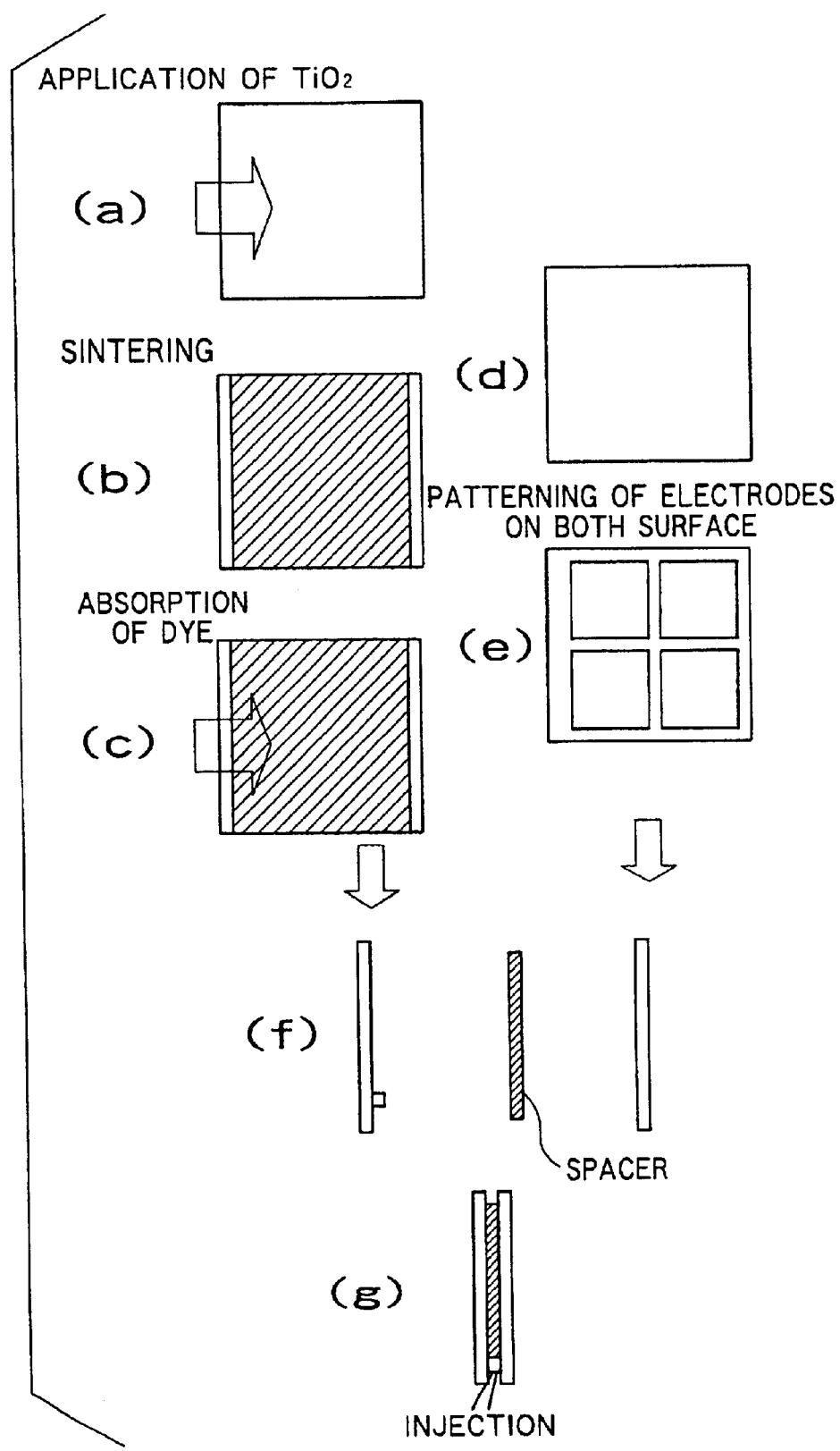
FIG. 7 is a conceptual drawing showing a principal part of a method for preparing a transmission photodetector according to the present invention.

FIG. 7 is a conceptual drawing showing a principal part of an example of a method for preparing a transmission photodetector according to the present invention.

First, a method for producing a $TiO_2$ film serving as the transparent semiconductor layer 16 is as follows. About 2 mol/l of $TiCl_4$ is dissolved in ethanol, and methanol is added thereto to obtain a titanium alkoxide containing about 50 mg/ml titanium. After the titanium alkoxide thus obtained is hydrolyzed, the hydrolyzed titanium alkoxide is applied on a first transparent electrode, on which platinum has been deposited as an auxiliary electrode (see FIG. 7(a)), to be sintered at about 400° C. for about 30 minutes to obtain a $TiO_2$ film serving as a transparent semiconductor (see FIG. 7(b)). At this time, the $TiO_2$ film preferably has a specific surface area of about 600 when irregularities are provided with respect to a case where the surface has been flat, and a thickness of about 5 μm.

Then, a sensitizing dye film 17 is absorbed onto the transparent semiconductor layer 16 thus formed (see FIG. 7(c)). At this step, the obtained $TiO_2$ film is immersed in a sensitizing dye containing ethanol solution. After it is immersed therein, the $TiO_2$ film is taken out to be washed with ethanol. In this preferred embodiment, the dye sensitizing transparent semiconductor electrode part is produced by the above described method.

The counter electrode part 12 is formed by patterning a transparent electrode on a transparent substrate (see FIGS. 7(d) and 7(e)).

The respective parts thus prepared are bonded and stacked via a spacer serving as a frame of the buffer layer (see FIG. 7(f)), and a carrier transporting substance or a dielectric is injected via a void of the spacer to complete assembly (see FIG. 7(g)).

In the example shown in FIGS. 2A and 2B, the counter electrode part 12 is divided, and the transparent electrode part 11 having the transparent semiconductor absorbing the sensitizing dye is not divided. However, the transparent electrode part 11 may be divided without dividing the other counter electrode part 12.

Figure 8:
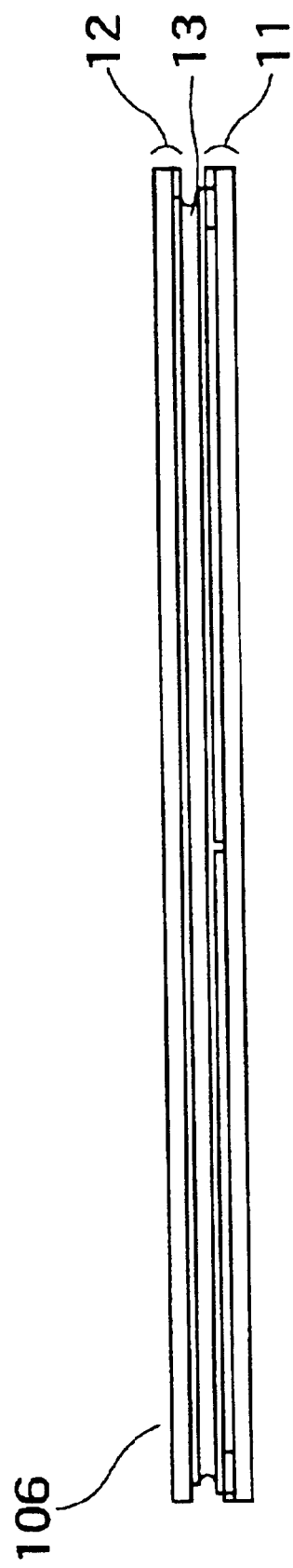
FIG. 8 is a sectional view showing an example of a construction wherein a counter electrode is not divided.

FIG. 8 is a sectional view showing an example of a construction wherein a counter electrode is not divided.

In the example shown in FIG. 5, the electrode cells are separated so as to have substantially equal areas, the electrode cells may be separated so as to have unequal areas.

Figure 9:
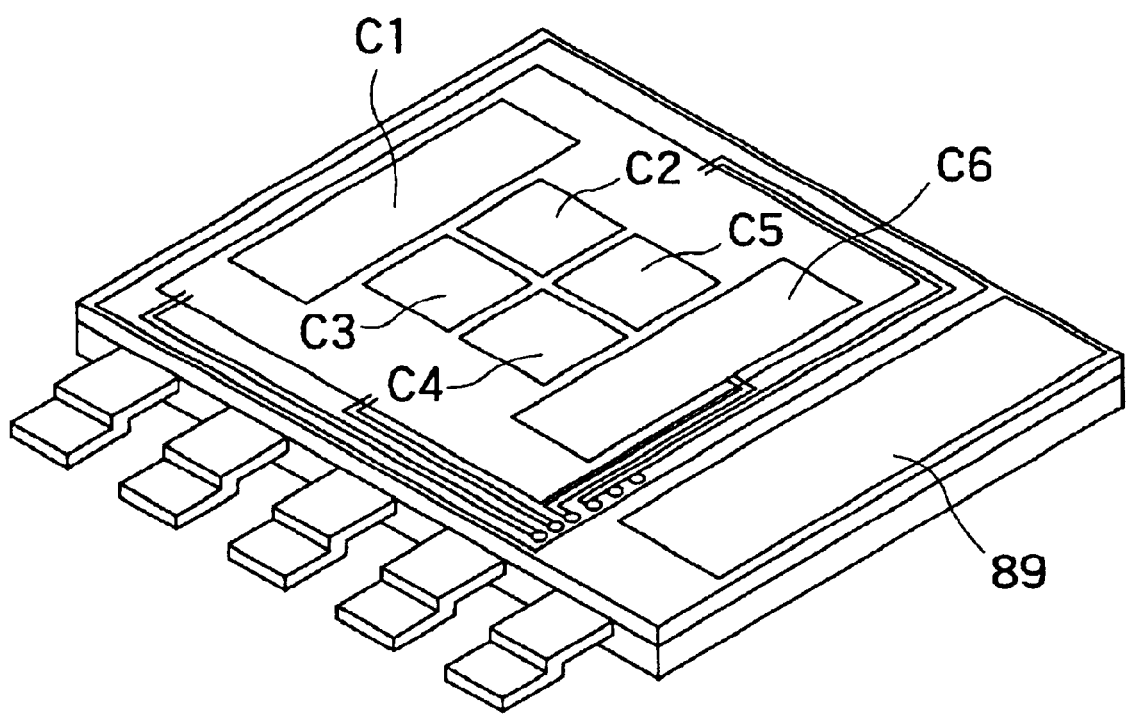
FIG. 9 is a conceptual drawing showing an example of a construction wherein an electrode cell is divided into unequal areas.

FIG. 9 is a conceptual drawing showing an example of a construction wherein electrode cells are separated so as to have unequal areas. That is, in this construction, electrode cells C1 through C6 are separated so as to have unequal areas.

Second Preferred Embodiment: Transmission Photodetector With Divided Electrode: Motion Vector Estimator: One-dimensional Scanner The second preferred embodiment of the present invention will be described below.

Figure 10A:
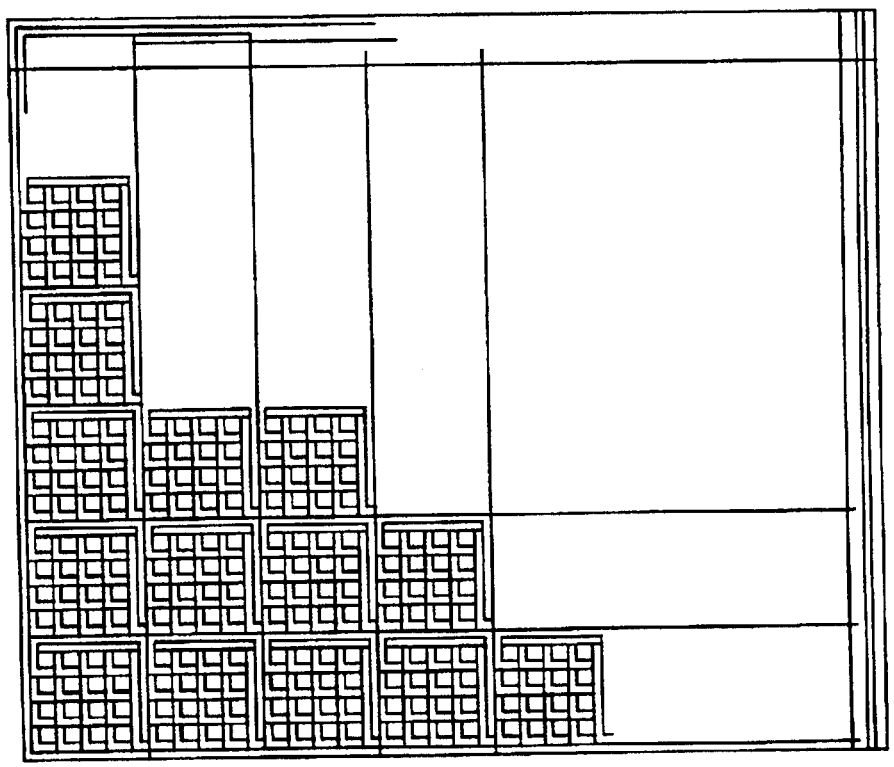
FIG. 10A is a plan view of the second preferred embodiment of a transmission photodetector according to the present invention.
Figure 10B:
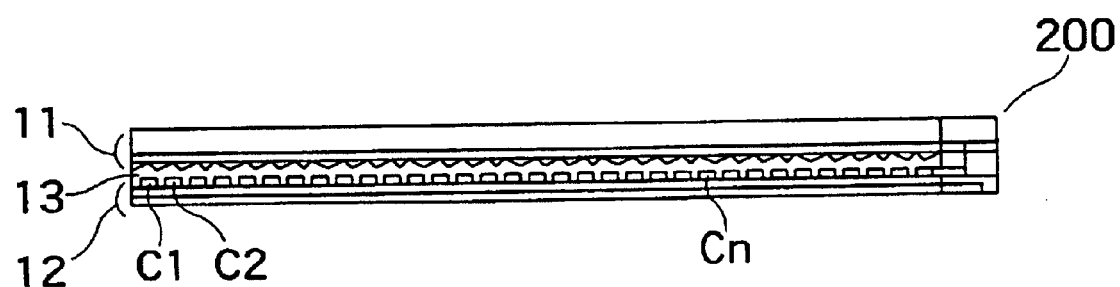
FIG. 10B is a sectional view of a principal part of the transmission photodetector in the second preferred embodiment.

FIGS. 10A and 10B show the appearance of the second preferred embodiment of a transmission photodetector 200 according to the present invention. FIG. 10A is a plan view thereof, and FIG. 10B is a sectional view of a principal part thereof.

The photodetector shown in the figures has a construction wherein a counter electrode surface 12 of the transmission photodetector described as the first preferred embodiment is divided into a plurality of cells C1, C2, . . . which have an equal area.

Figure 11:
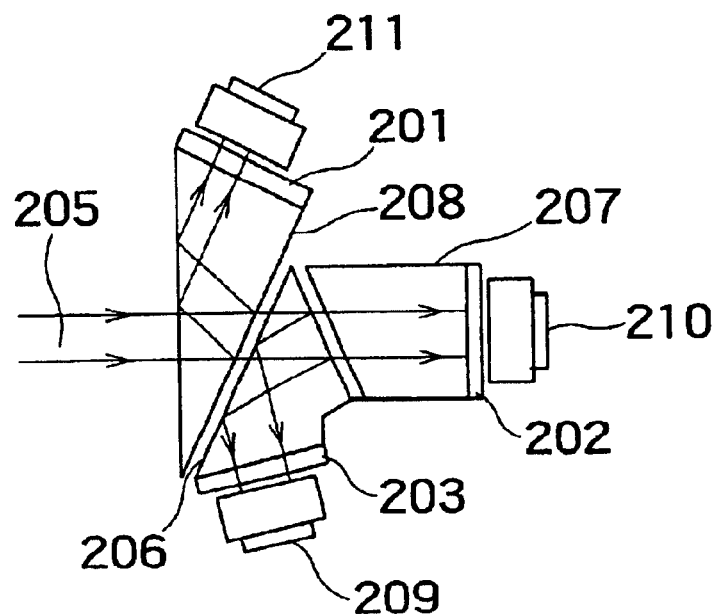

FIG. 11 shows an example where the transmission photodetector in this preferred embodiment is arranged in a detecting optical system for use in a video camera or the like. In the case of the use in this preferred embodiment, the matrix of the electrode cells has a large scale of 600×480 or the like.

A typical image sensor for a video camera is provided with an optical system shown in FIG. 11, which has three CCDs in order to separate incident light beams into three kinds of wavelength bands of RGB to detect them, respectively. In FIG. 11, a red component is separated by a prism 206, which is arranged in an optical path 205, to be detected by a CCD 209. In addition, a green component separated by a prism 207 is detected by a CCD 210, and a blue component separated by a prism 208 is detected by a CCD 211. By adapting this detecting optical system, light intensity signals separated into three colors to be detected can be extracted as information signals.

If transmission photodetectors 201, 202 and 203 in this preferred embodiment are arranged as shown in FIG. 11, part of picture signals inputted to the respective CCDs can be used for estimating a "motion vector" of an image. This motion vector is used for compensating the "movement" of picture signals, i.e., a so-called "movement of the hands", which is caused by the influence of the vibration of a person, who picks up an image, on a video camera, and for grasping picture signals, which move on a CCD sensor at a predetermined frequency, as a moving direction and a moving distance. After this motion vector is estimated, if it is determined that there is a hand movement component, the picture signals are corrected in accordance with the motion vector to record signals as picture signals from which the influence of the movement of the hands has been removed.

In fact, the detecting optical system is constructed as shown in FIG. 11, and the differentiated value, i.e., the time variation, of picture signals detected in the respective electrode cells Cn (n=1, 2, . . . ) in the preferred embodiment shown in FIGS. 10A and 10B is obtained, so that the motion vector can be estimated. Furthermore, in the transmission photodetector 200 in this preferred embodiment, if the buffer layer 65 is formed of a carrier transporting substance, an additional differentiating circuit is required, whereas if the buffer layer 65 is formed of a dielectric, the differentiated signal of an inputted light signal can be extracted as a signal output as shown in FIG. 6. That is, if the buffer layer 65 is formed of a dielectric, the differentiated value of a signal can be immediately obtained by utilizing it in the use requiring a differentiating circuit.

Figure 12:
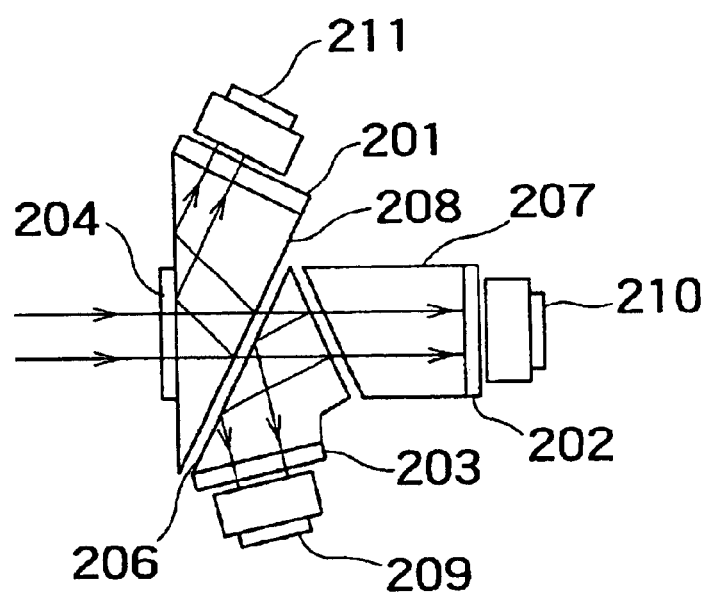
FIG. 12 is a conceptual drawing showing a construction wherein a transmission photodetector 204 is arranged at one place.

While three transmission photodetectors have been arranged in the construction of FIG. 11, a single transmission photodetector 204 may be arranged as shown in FIG. 12. In this case, if the sensitizing dye film of the transmission photodetector 204 is set so as to absorb wavelength components which do not interfere with RGB components of picture signals, it is possible to carry out a motion vector estimation without deteriorating the quality of the original picture signals.

When the electrode cells having a large matrix structure are adopted as shown in FIGS. 10A and 10B as an example, the sequential signal reading system is often used for detecting signals in the respective cells. In brief, in this system, condensers are provided so as to correspond to the respective electrode cells, so that the respective electrode cells are previously charged at a specific voltage. This voltage is periodically and sequentially charged for each of the cells. If discharge occurs for some reason, a voltage required for charge can be extracted as a signal. When a pulse current flows through one of the electrode cells of the photodetector, if the circuit is constructed so that a corresponding one of the condensers discharges in accordance with the current value, the value of the pulse signal can be detected as a charged value when an additional charge is periodically carried out.

Third Preferred Embodiment: Input Unit Arranged Directly on Screen

The third preferred embodiment of the present invention will be described below.

Figure 13:
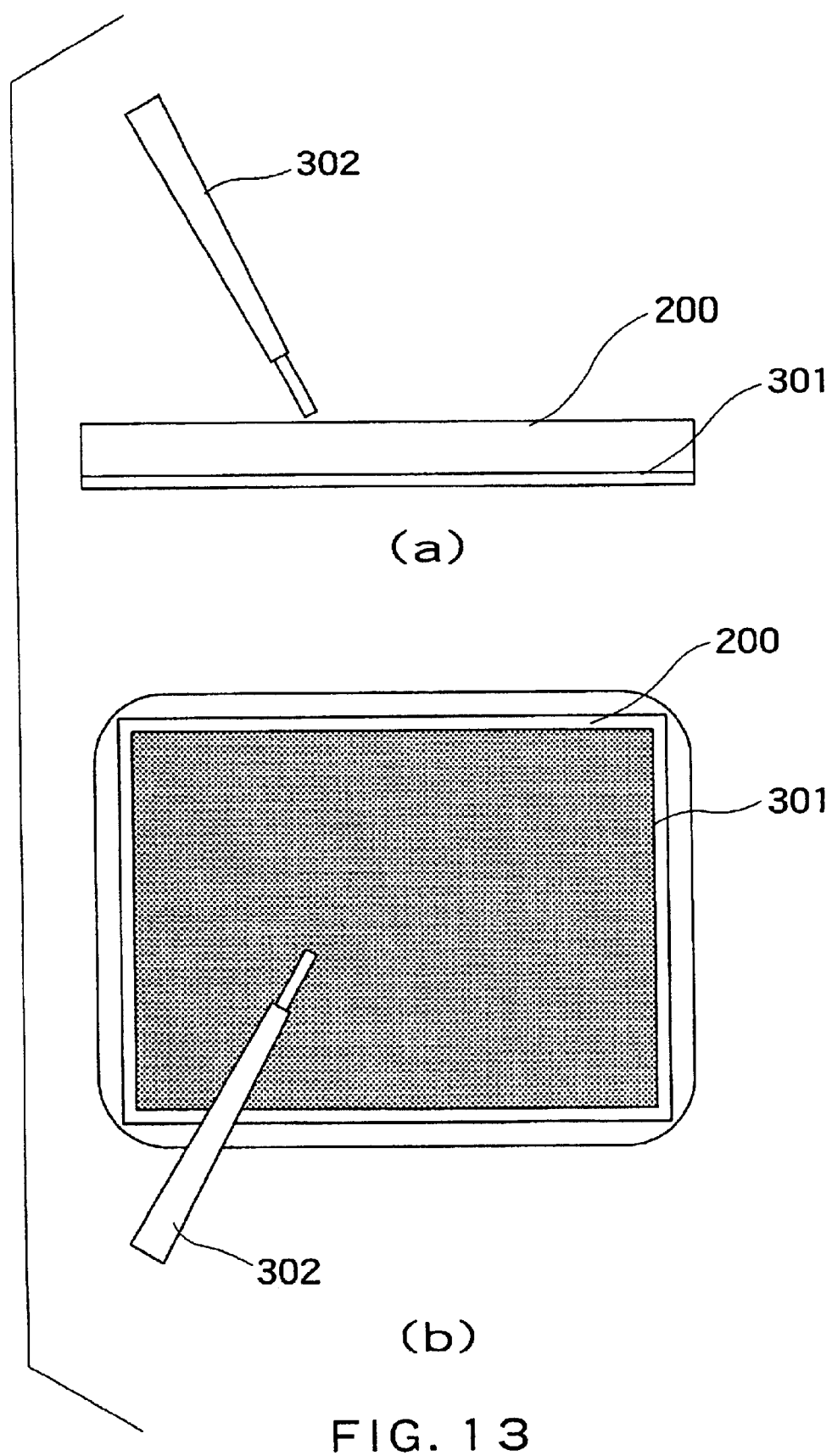
FIG. 13 is a conceptual drawing for explaining the third preferred embodiment of the present invention.

FIG. 13 is a conceptual drawing for explaining the third preferred embodiment of the present invention. That is, in this preferred embodiment, the transmission photodetector 200 in the second preferred embodiment is arranged on an original screen 301 to acquire image information of the original screen. In this preferred embodiment, external light reflecting on the original surface 301 to return is detected by the transmission photodetector 200, so that the image information of the original surface can be received.

The original surface 301 may be image signals on an electronically projected display, or image information drawn on a paper.

By means of a pen-like input terminal 302 capable of outputting light beams of wavelengths, which can be detected by the transmission photodetector 200 according to the present invention, i.e., laser beams of a predetermined wavelength, it is possible to write on the photodetector to input information. In this case, image information having originally existed on the original surface 301 has been detected from the reverse of the transmission photodetector 200, so that information inputted by the input terminal 302 can be electronically aligned with the originally existing image information to be inputted.

Fourth Preferred Embodiment: Actuator with Sensor

Figure 14:
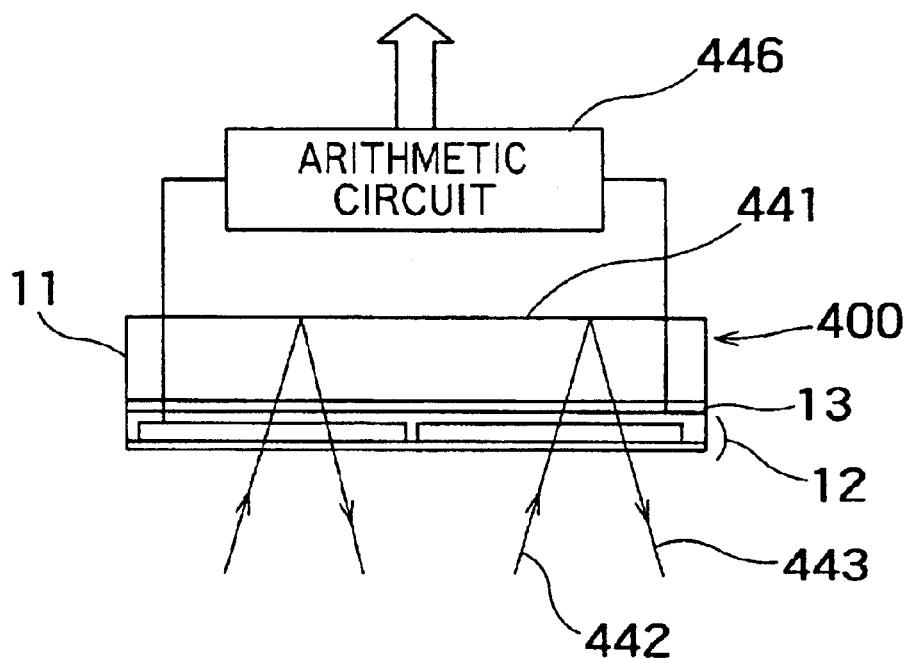
FIG. 14 is a conceptual drawing showing the construction of the fourth preferred embodiment of a transmission photodetector according to the present invention.
Figure 15:
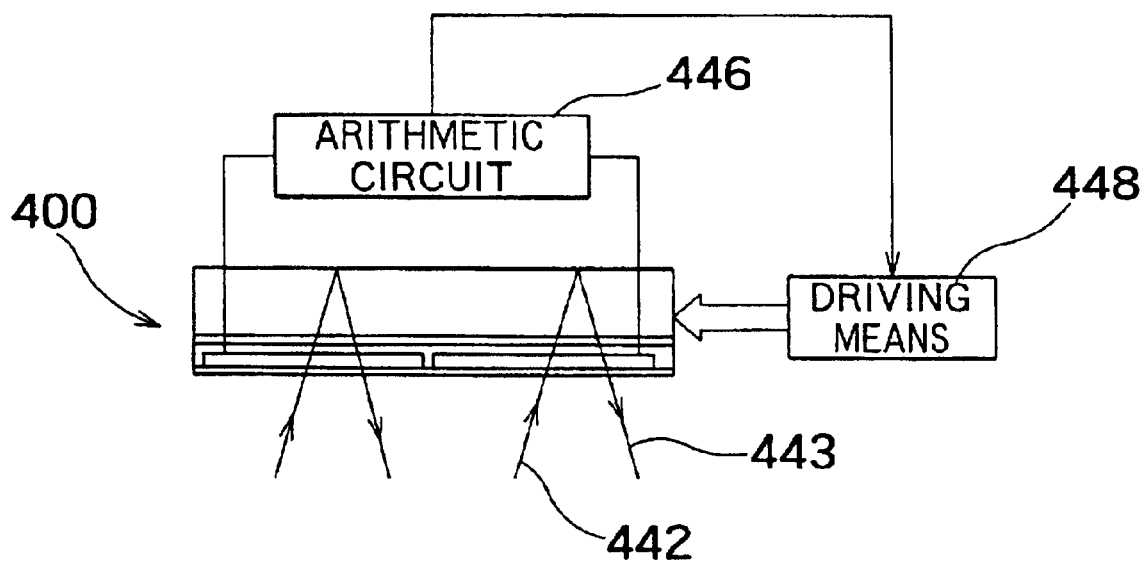
FIG. 15 is a conceptual drawing showing the construction of the fourth preferred embodiment of a transmission photodetector according to the present invention.

FIGS. 14 and 15 are conceptual drawings showing the construction of the fourth preferred embodiment of a transmission photodetector according to the present invention. In this transmission photodetector 400, the thickness of the transparent substrate 14 of the transparent electrode part 11 of the transmission photodetector 100 shown in FIGS. 2A and 2B is increased, and a mirror surface 441 is provided. In the transmission photodetector 400 with this construction, incident light beams 442 reflect on the mirror surface 441 to be reflected light beams 443, with which the four divided electrode cells of the counter electrode part 12 are irradiated twice. As shown in these figures as an example, when the incident light beams 442 are obliquely incident on the mirror surface 441, the inclined angle can be detected by comparing signals, which are detected by the respective electrode cells, by means of an arithmetic circuit 446.

In addition, if the detected signal current is used as it is or after passing through an amplifier circuit, to be inputted to a driving means 448 for driving the transparent photodetector as shown in FIG. 15, the mirror surface 441 of the transmission photodetector 400 can be rotated to be adjusted so as to correct the detected inclined angle.

That is, there is realized a system having the function of correcting the angle on the basis of the signal detected by the transmission photodetector 400. The driving means 448 may be any one of driving systems, such as electromagnetic, piezoelectric and electrostatic driving systems. However, when the detected current value is used as it is, the current value detected by the photodetector is very small, so that it is considered that the electrostatic driving system is suitably used.

While the correction has been carried out by the rotation in this preferred embodiment, a servo mechanism may be provided so that the output of the arithmetic circuit has a predetermined value by parallel translations or other motions.

While the object to be driven has been the transmission photodetector itself in this preferred embodiment, it may be another object (not shown), such as the power of a light source for supplying light which is incident on the transmission photodetector.

Fifth Preferred Embodiment: Alignment/Incident Light from Both Surface

The fifth preferred embodiment of the present invention will be described below.

Figure 16:
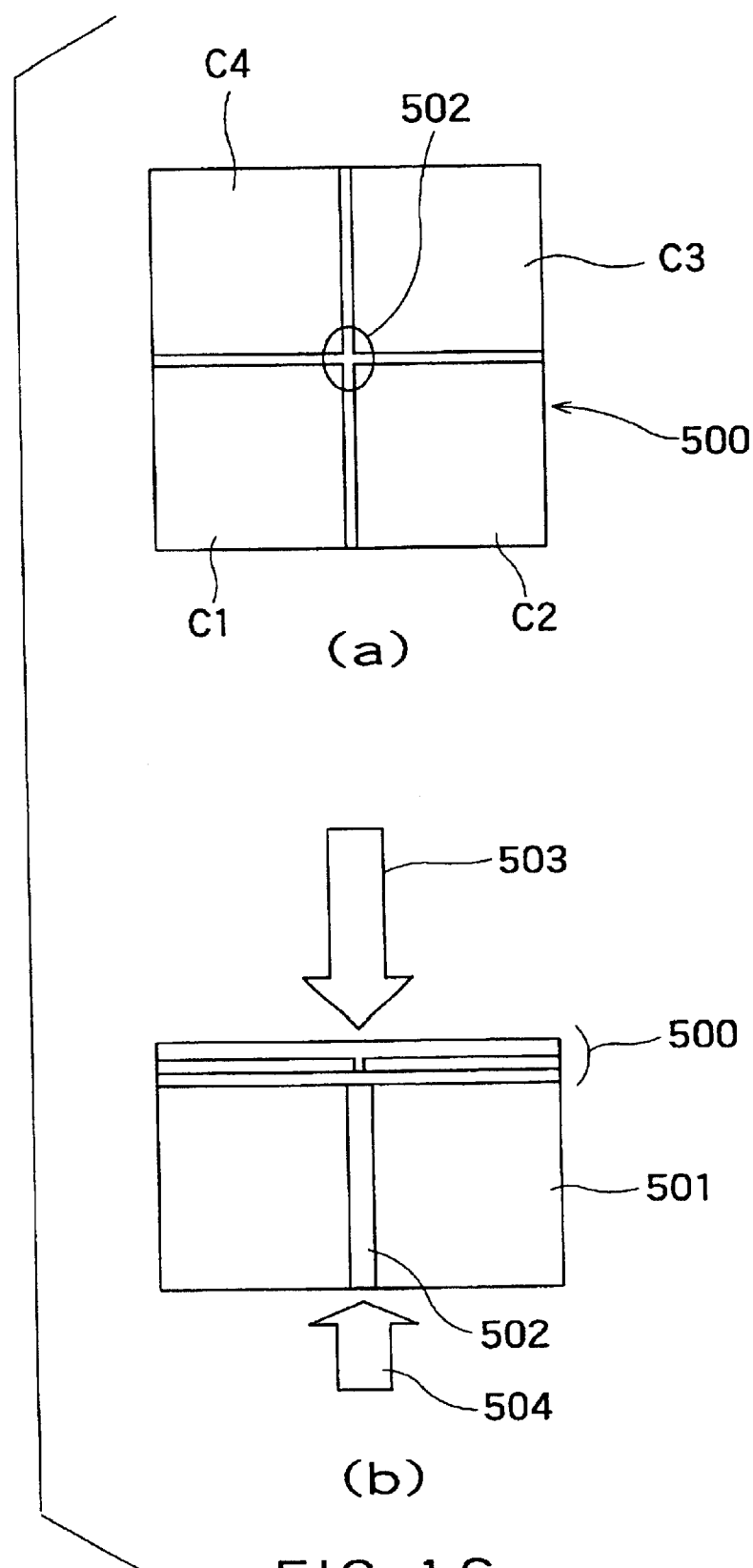
FIG. 16(*a*) is a plan view of the fifth preferred embodiment of a transmission photodetector according to the present invention, and FIG. 16(*b*) is a sectional view of a principal part thereof.

FIG. 16(a) is a plan view of a transmission photodetector in this preferred embodiment, and FIG. 16(b) is a sectional view of a principal part thereof.

This preferred embodiment is suitable for case where a member 501 having a minute hole 502 is irradiated with incident light 503 to precisely align the center of the optical axis of incident light with the center of the hole 502. In the alignment procedure, a reference beam 504 is first given from the reverse of the member 501 having the hole, and while the light beam passing through the hole is detected by the four divided electrode cells C1 through C4, the transmission photodetector 500 is aligned with the member 501 to be fixed thereto by an adhesive or the like.

Thereafter, the transmission photodetector 500 is irradiated with incident light 503, and while the incident light 503 is detected by the four divided electrode cells C1 through C4, the optical axis is aligned. Thus, the transmission photodetector according to the present invention can detect irradiation light on both surfaces, so that the shown adjusting procedure can be carried out.

The transmission photodetectors having the plurality of divided electrodes have been described above in the first through fifth preferred embodiment of the present invention.

As the sixth through twelfth preferred embodiments of the present invention, transmission photodetectors having a plurality of stacked cells will be described below.

Sixth Preferred Embodiment: Double-Layer Photodetector with Divided Electrodes

First, the sixth preferred embodiment of the present invention of the present invention will be described below.

FIG. 17(a) is a perspective view showing the appearance of the sixth preferred embodiment of a stacked transmission photodetector according to the present invention, and FIG. 17(b) is a sectional view thereof.

This photodetector 600 comprises a first transmission photo detecting unit 10 for selectively absorbing a light beams of a first wavelength band to carry out a photoelectric transfer, and a second transmission photo detecting unit 30 for selectively absorbing a light beam of a second wavelength band to carry out a photoelectric transfer, the first transmission photo detecting unit 10 being stacked on the second transmission photo detecting unit 30 via a transparent substrate 50 of an insulator.

The first transmission photo detecting unit 10 comprises a first dye sensitizing transparent semiconductor electrode part 11, a first counter electrode part 12, and a first buffer layer 13 which is sandwiched between both electrode parts. The first dye sensitizing transparent semiconductor electrode part 11 comprises a transparent electrode 15 and transparent semiconductor layer 16 which are formed on a transparent substrate 23, and a sensitizing dye film 17 which is absorbed onto the semiconductor layer 16.

Similarly, the second transmission photo detecting unit 30 comprises a second dye sensitizing transparent semiconductor electrode part 31, a second counter electrode part 32, and a second buffer layer 33 which is sandwiched between both electrode parts. The second counter electrode part 32 is formed on the reverse surface of the first counter electrode part 12 via the transparent substrate 50. Similar to the first dye sensitizing transparent semiconductor electrode part, the second dye sensitizing transparent semiconductor electrode part 31 comprises a transparent electrode 35 and transparent semiconductor layer 36 which are formed on a transparent substrate, and a sensitizing dye film 37 which is absorbed onto the semiconductor layer 36.

The first counter electrode part 12 comprises a transparent electrode part which is formed on the transparent substrate 50. As shown in the figure, this transparent electrode is divided into two cells 18 and 19 which are electrically isolated from each other, and wires 20 and 21 are arranged so as to be able to separately extract current signals which are generated in the respective electrode cells.

On the other hand, the second counter electrode part provided on the reverse surface of the transparent substrate 50 is divided into cells 38 and 39, each of which has the same shape as that of each of the divided cells of the first counter electrode. The cells 18 and 19 are aligned with the cells 38 and 39 via the transparent substrate 50, respectively. Also in the second transparent electrode, wires 40 and 41 are arranged to as to be able to separately extract current signals which are generated in the respective electrode cells.

The wire 22 of the first transparent electrode and the wire 42 of the second transparent electrode are connected to each other to be grounded.

Figure 17:
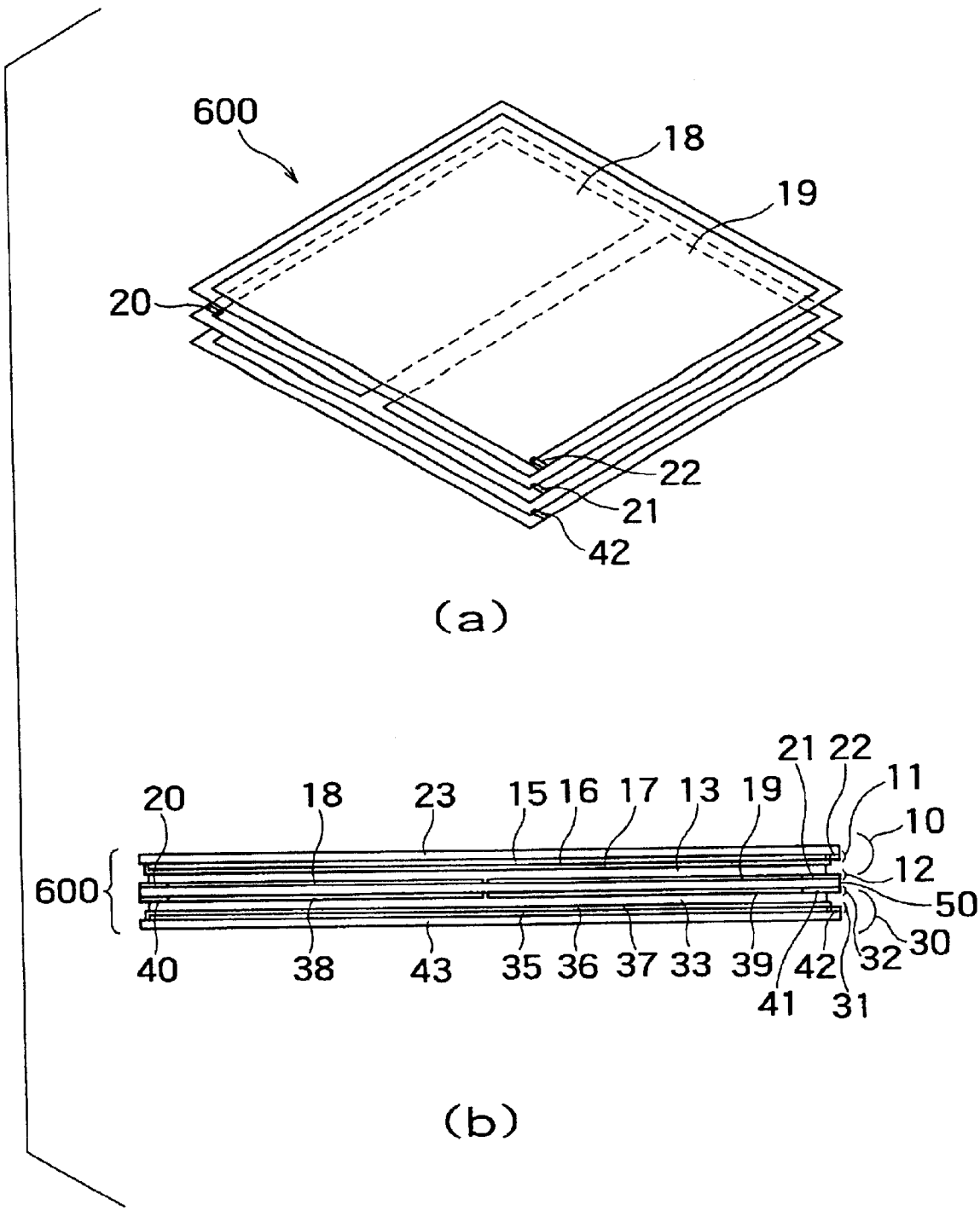
FIG. 17(*a*) is a perspective view showing the appearance of the sixth preferred embodiment of a stacked type transmission photodetector according to the present invention, and FIG. 17(*b*) is a sectional view thereof.

While each of the counter electrode parts has been divided into the two cells in the example shown in FIG. 17, it may be divided into a plurality of linear cells, or a plurality of cells in the form of a matrix. The respective transparent electrodes and electrode parts are symmetrically divided with respect to on a point or line the center of the optical axis of incident light.

Figure 18:
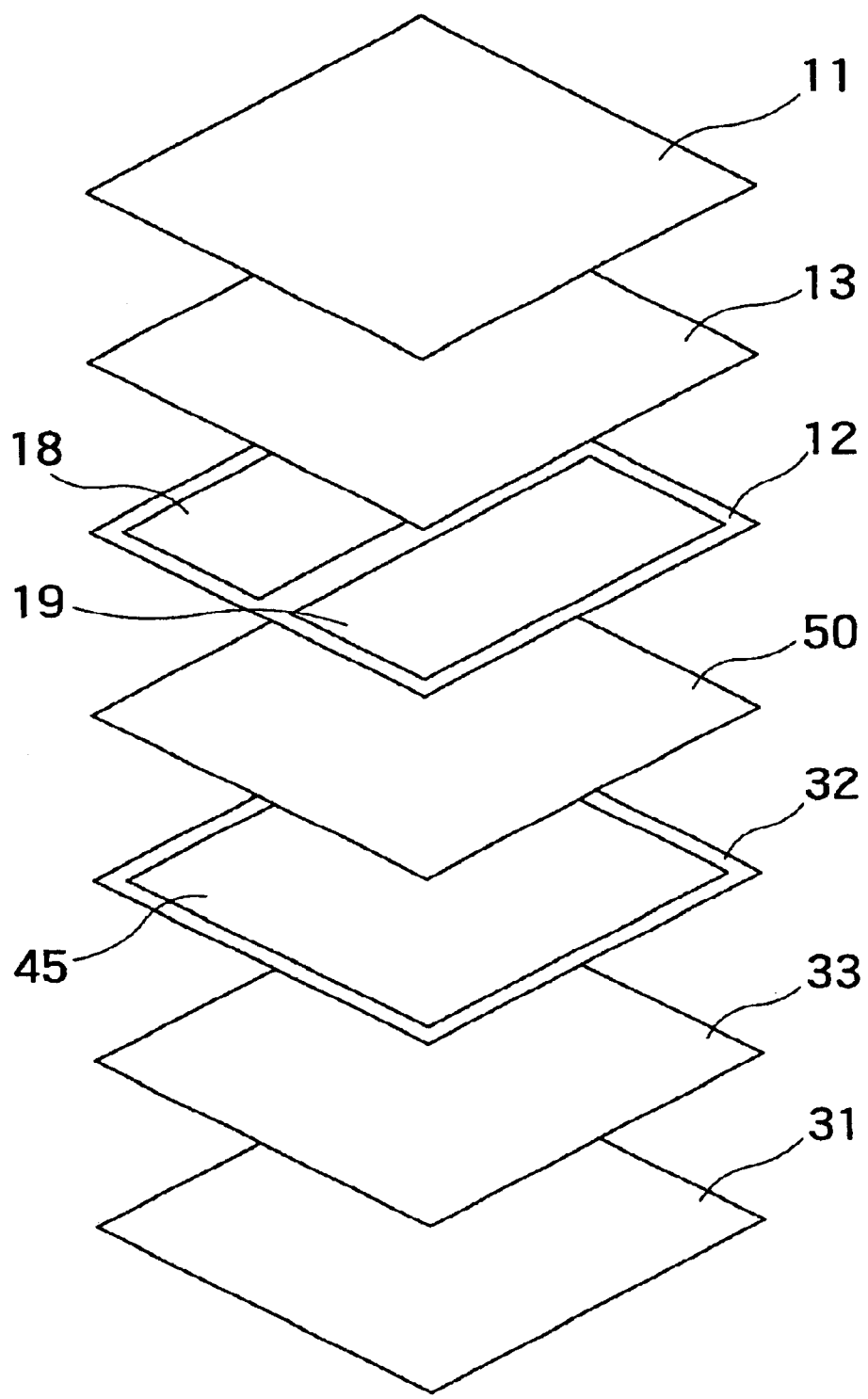
FIG. 18 is a conceptual drawing showing a construction wherein a transparent electrode of a second counter electrode part is not divided.

At least one of the first and second counter electrode parts may be divided. As shown in FIG. 18 as an example, only the first counter electrode part may be divided into electrode cells 18 and 19 without dividing the transparent electrode 45 of the second counter electrode part.

The basic operation of the transparent photo detecting units 10 and 30 constituting the stacked type transmission photodetector in this preferred embodiment with the above described construction is the same as that described referring to FIG. 1B, so that the detailed descriptions thereof are omitted.

In the stacked type transmission photodetector shown in FIG. 17 as an example, light beams, which have not been absorbed by the first transmission photo detecting unit 10, pass through the transparent substrate 50 to be incident on the second transmission photo detecting unit 30. Also in this case, a current corresponding to the quantity of light, with which the respective cells are irradiated, can be similarly detected by the pattern of the divided cells of the transparent electrode provided on the counter electrode part 32.

In the stacked type transmission photodetector 600 with the above described construction, the first sensitizing dye film and the second sensitizing dye film may have the same composition, or different compositions.

Figure 19:
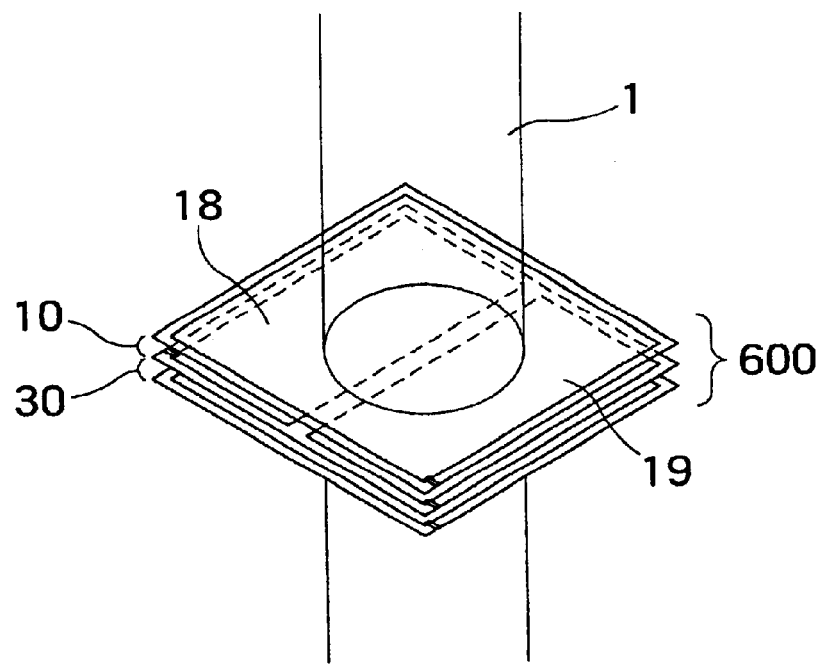
FIG. 19 is a conceptual drawing showing a detecting optical system.

When the sensitizing dye films having the same composition are used, a detecting optical system for detecting the shift of the axis of incident light 1 in view of the outputs of the divided electrode cells can be formed by the detecting optical system having the construction shown in FIG. 19 as an example. In this case, light beams of a wavelength detected by the sensitizing dye films are detected by the first and second photo detecting units 10 and 20, so that it is possible to increase the detection sensitivity.

On the other hand, when the first and second sensitizing dye films have different compositions, a first wavelength band detected by the first transmission photodetector can be different from a second wavelength band detected by the second transmission photodetector. A preferred embodiment of a transmission photodetector for detecting different wavelength bands according to the present invention will be described below.

Figure 20:
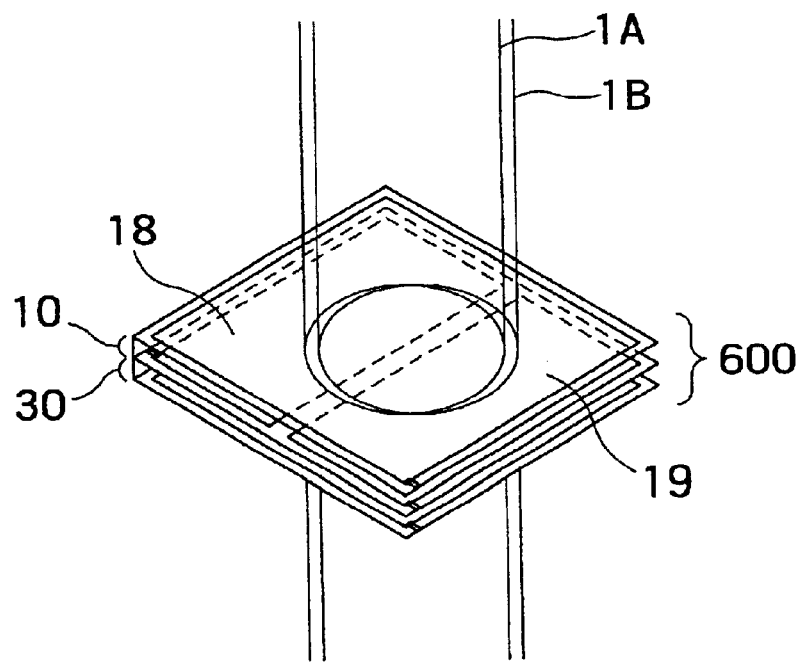
FIG. 20 is a conceptual drawing a construction for detecting different two kinds of wavelengths.

FIG. 20 is a conceptual drawing showing a construction for detecting two kinds of different wavelengths. In the construction shown in this figure, a stacked type transmission photodetector 600 according to the present invention is provided in an optical path for light beams in a wavelength band having a wide band width, or in an optical path in which light beams having a plurality of wavelengths are mixed. The first transmission photo detecting unit can use light beams having a first wavelength band to carry out a photoelectric transfer to detect currents corresponding to the respective cells, and simultaneously, use light beams having a second wavelength band to carry out a photoelectric transfer to similarly detect current corresponding to the respective cells.

For example, when two laser beams 1A and 1B of different wavelengths are incident on the stacked type transmission photodetector 600 according to the present invention, the difference between the output current values of the two divided electrode cells of the first transmission photo detecting unit 10 is derived to grasp the position of the optical axis of one laser beam 1A belonging to the first waveform band, and then, the difference between the output current values of the two divided electrode cells of the second transmission photo detecting unit 30 is derived to calculate the position of the optical axis of the other laser beam 1B belonging to the second wavelength band, so that it is possible to detect the quantity of one-dimensional shift between both of the optical axes.

In this case, the stacked type transmission photodetector 600 may be provided in the optical paths 1A and 1B, and light beams passing through the photodetector 600 can be applied to another use. In addition, the quantity of position shift can be very simply and inexpensively detected. Moreover, if the photodetector has four divided electrode cells, the quantity of two-dimensional shift can be detected.

Figure 21:
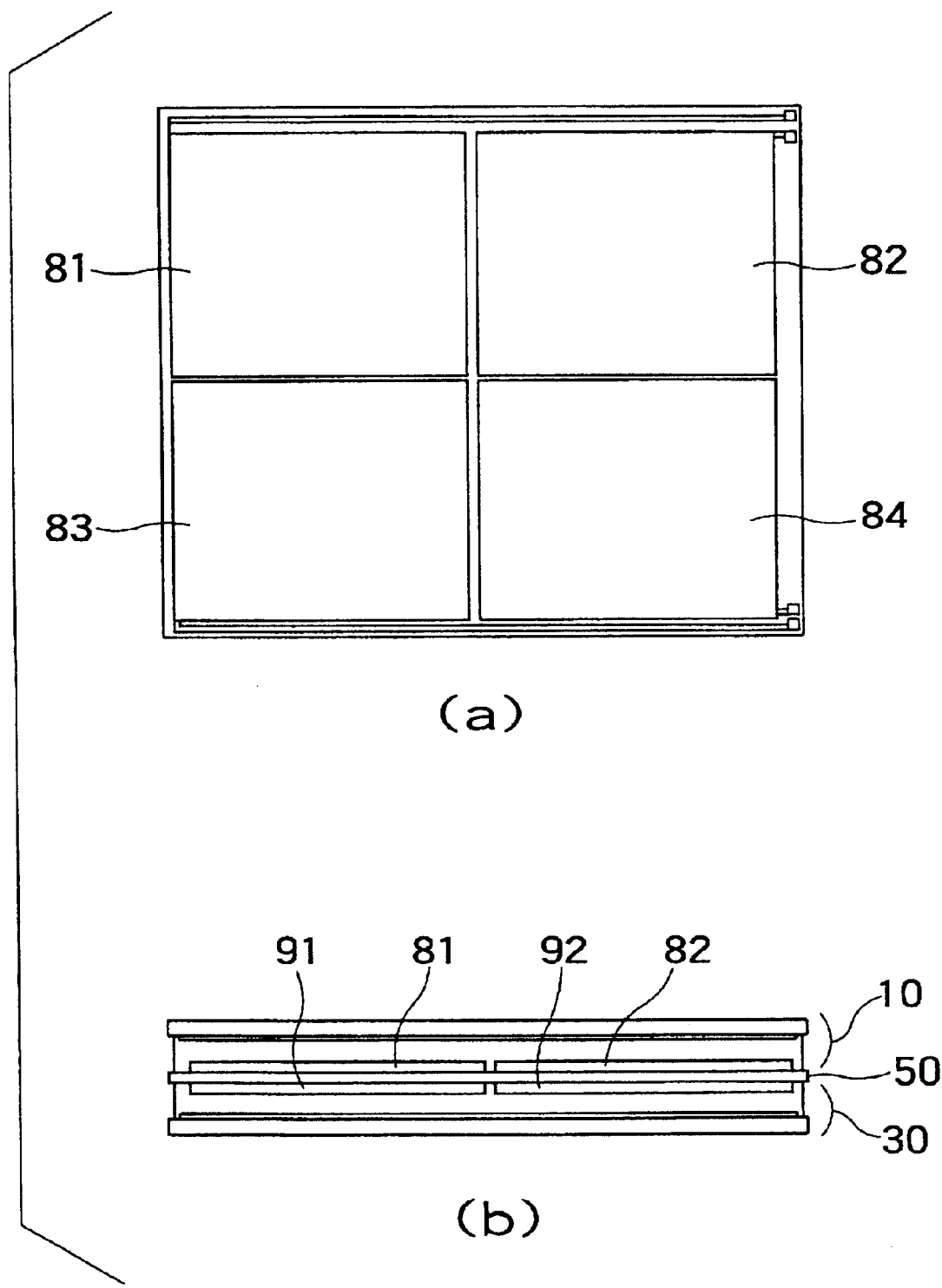
FIGS. 21(a) and 21(b) are plan and sectional views showing an example of a construction wherein an electrode cell of a detector is divided into four parts.

FIGS. 21(a) and 21(b) are plan and sectional views showing an example of a construction wherein each of photodetectors has four divided electrode cells.

When signals thus obtained in the respective electrode cells 81, 82, 83 and 84 are used for carrying out a signal processing, a signal processing circuit is preferably provided so as to be very close to the photodetector in order to detect and process a very weak current with a high S/N.

Figure 22:
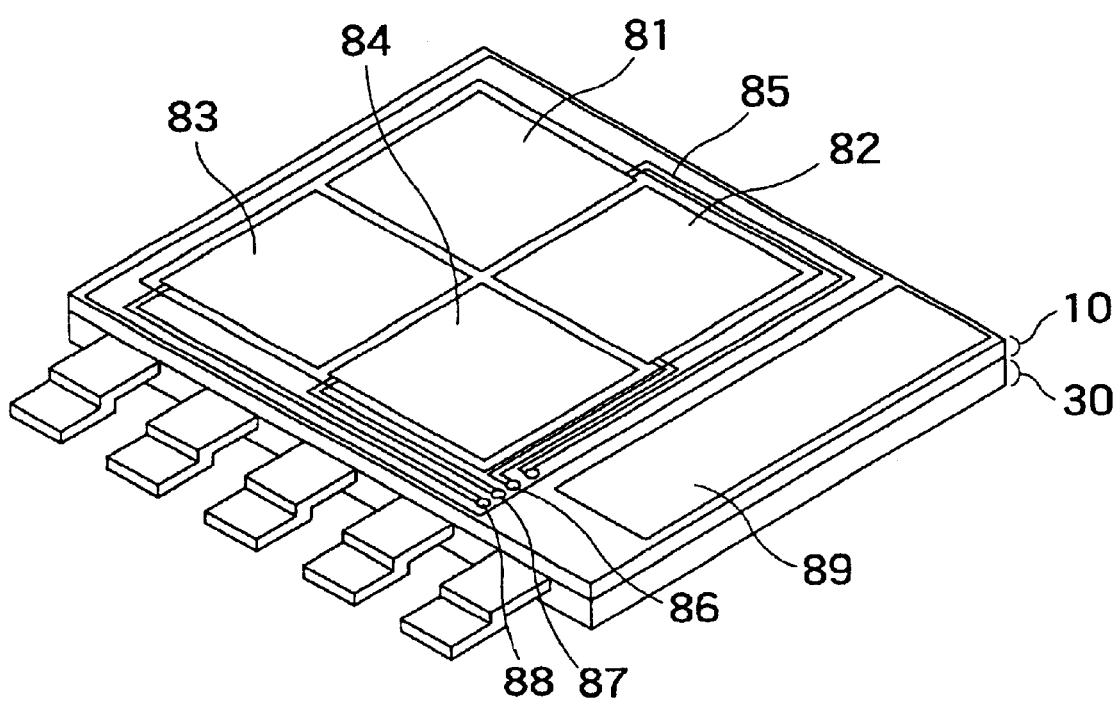
FIG. 22 is a conceptual drawing showing a preferred embodiment of a double-layer stacked type transmission photodetector having an electrode cell divided into four parts.

FIG. 22 is a conceptual drawing showing a preferred embodiment of a double-layer stacked type transmission photodetector having four divided electrode cells according to the present invention. That is, the signals of the respective electrode cells 81, 82, 83 and 84, which are detected by the first transmission photodetector 10, are inputted to a signal processing circuit 89 via wires 85, 86, 87 and 88. The respective signals of the second transmission photodetector 30 are similarly inputted to the signal processing circuit 89 via a signal path (not shown), so that operations such as addition and subtraction with respect to the respective signals are carried out.

In the stacked type transmission photodetector described in this preferred embodiment, the carrier transporting substance has been used as the buffer layer 65. In this case, a current flows between the electrodes while light beams are incident, and no current flows while no light beams are incident. As described above in the first preferred embodiment, also in this preferred embodiment, the buffer layer 65 may be formed of a dielectric. As described above referring to FIG. 6, if the dielectric is used, the speed of response of the unit can be higher than that when the carrier transporting substance is used, so that it is possible to response to signals in tens MHz.

The materials of the respective members of the stacked type transmission photodetector in this preferred embodiment, i.e., the materials of transparent substrates 23, 24 and 50, transparent electrodes 15, 18, 19, 35, 38 and 39, auxiliary electrodes, transparent semiconductors 16 and 36, sensitizing dye films 17 and 37 and dielectric materials, and a method for producing the same may be the same as those in the first preferred embodiment. Therefore, the detailed descriptions thereof are omitted.

Figure 23:
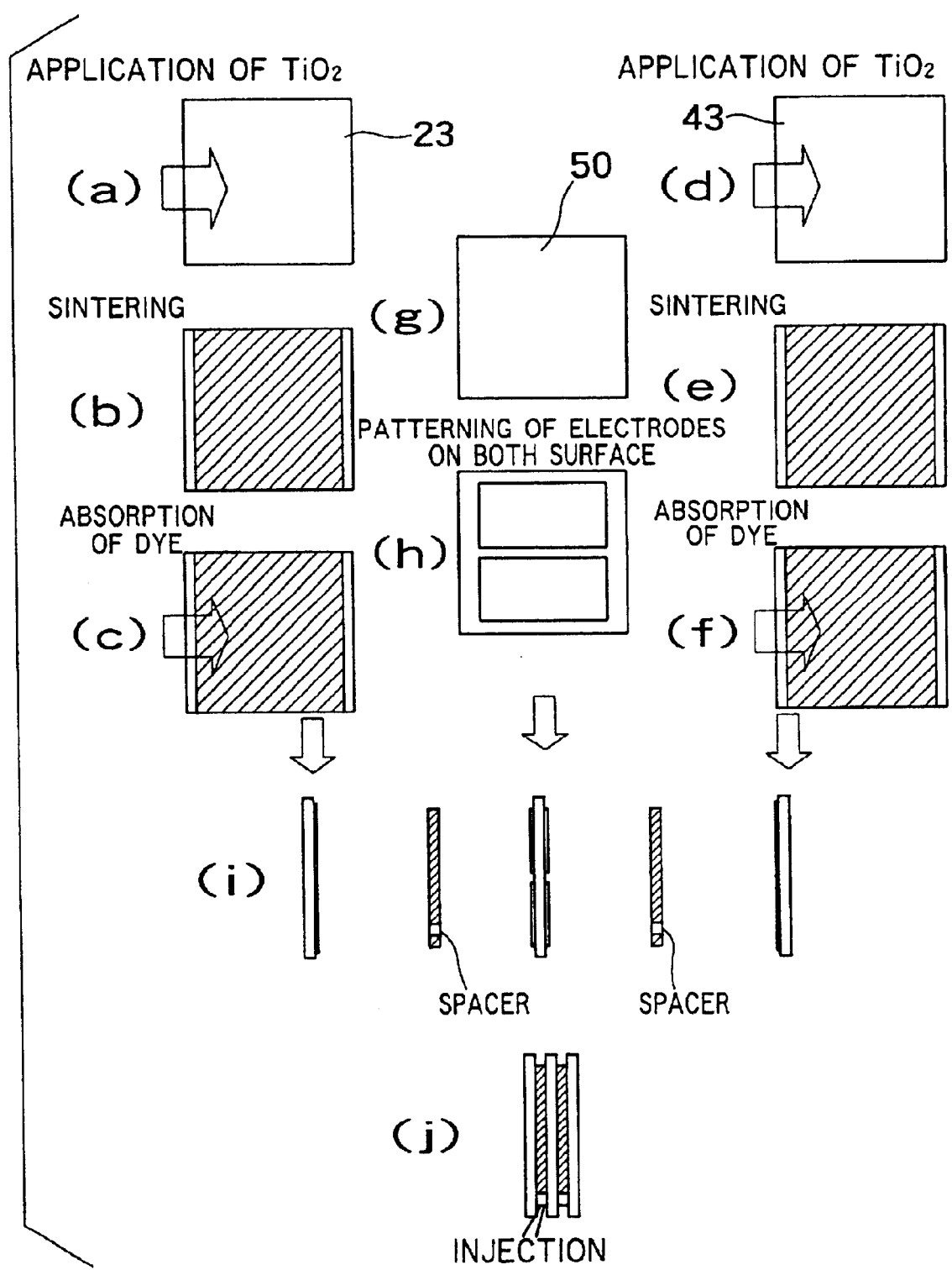
FIG. 23 is a process drawing showing a principal part of a method for preparing the sixth preferred embodiment of a stacked type transmission photodetector 600 according to the present invention.

FIG. 23 is a process drawing showing a principal part of a method for preparing the stacked type transmission photodetector 600 in this preferred embodiment.

First, two transparent substrates 23 and 43 are prepared, and a $TiO_2$ film serving as a transparent semiconductor is applied on the surface of each of the substrates (see FIGS. 23(a) and 23(b)), to be sintered (see FIGS. 23(c) and 23(d)). Then, a sensitizing dye is absorbed thereon (see FIGS. 23(e) and 23(f)). The details of these steps have been described above referring to FIGS. 7(a) through 7(c).

In parallel to these steps, an intermediate transparent substrate 50 is prepared (see FIG. 23(g)), and transparent electrodes are patterned on both surfaces thereof (see FIG. 23(h)).

The respective parts thus prepared are bonded and stacked via a spacer serving as a frame of the buffer layer as shown in FIG. 23(i), and a carrier transporting substance or a dielectric is injected via a void of the spacer to complete assembly (see FIG. 23(j)).

According to this preferred embodiment, divided transparent electrode patterns are formed on both surfaces of the intermediate transparent substrate 50. Therefore, it is not required to carry out a complicated step of separately forming detecting units 10 and 30 to subsequently align the axes of both of the divided patterns with each other.

Seventh Preferred Embodiment: Triple-Layer Stacked Type Photodetector with Divided Electrodes: One-dimensional Image Sensor: Scanner The seventh preferred embodiment of the present invention will be described below.

Figure 24:
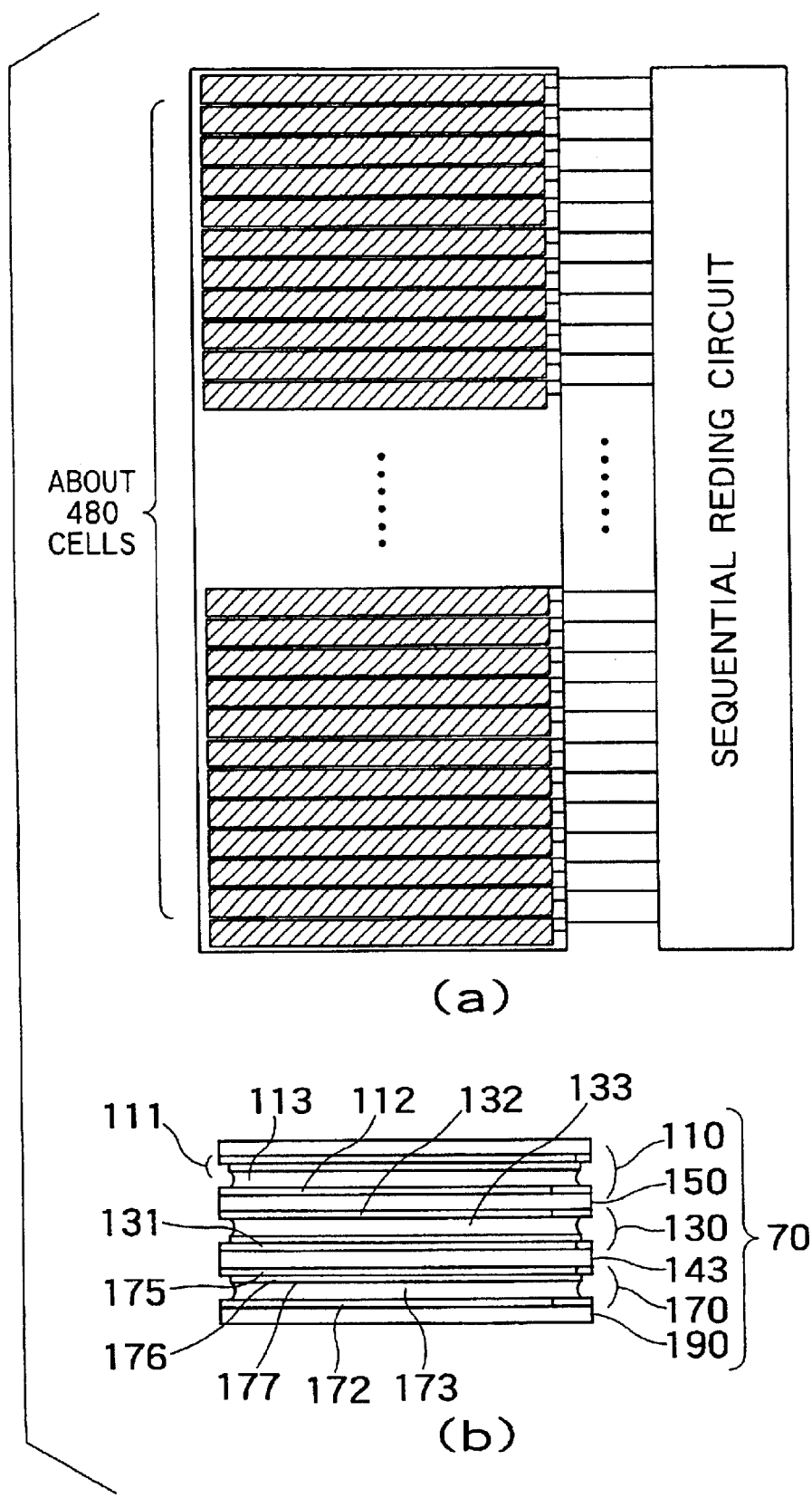
FIG. 24(a) is a plan view showing the appearance of the sixth preferred embodiment of a stacked type transmission photodetector 700 according to the present invention.
FIG. 24(b) is a sectional view of a principal part thereof.

FIG. 24(a) is a plan view showing the appearance of the seventh preferred embodiment of a stacked type transmission photodetector 700 according to the present invention, and FIG. 24(b) is a sectional view of a principal part thereof.

In the photodetector in this preferred embodiment, an additional layer of a third transmission photo detecting unit is stacked on the double-layer stacked type transmission photodetector 600 in the sixth preferred embodiment.

That is, a first transmission photo detecting unit 110 for responding to light beams of a first wavelength band to carry out a photoelectric transfer is provided nearest to the plane of incident on which light is incident, and subsequently, a second transmission photo detecting unit 130 for carrying out a photoelectric transfer with respect to light beams of a second wavelength band is provided via a transparent substrate 150. The constructions of the first and second transmission photo detecting units are the same as those in the sixth preferred embodiment, so that the descriptions thereof are omitted.

In this preferred embodiment, a third transmission photo detecting unit 170 is constructed so that a third dye sensitizing transparent semiconductor electrode part is formed on the reverse surface of a transparent substrate 143 on which a dye sensitizing transparent semiconductor electrode part 131 of a second transparent photo detecting unit 130 is provided. That is, the third dye sensitizing transparent semiconductor electrode part comprises a transparent electrode 175 and transparent semiconductor layer 176 which are formed on the reverse surface of the transparent substrate 143 of the second dye sensitizing transparent semiconductor electrode part 131, and a sensitizing dye film 177 which is absorbed onto the semiconductor layer 176. The third transmission photo detecting unit 170 comprises a third counter electrode part 172 on the opposite surface to the third dye sensitizing transparent semiconductor electrode part, and a third buffer layer 173 which is sandwiched between both of the electrodes.

In this preferred embodiment, each of the transparent electrodes of the counter electrode parts is divided into, e.g., about 480 cells, and the respective transmission photo detecting units are stacked so that the cells of one of the transmission photo detecting unit are aligned with the cells of the other transmission photo detecting unit. The divided electrode cells of the first transmission photo detecting unit 110 and the divided electrode cells of the second transmission photo detecting unit 130 are formed on the same substrate 150 similar to the sixth preferred embodiment, so that the alignment can be easily carried out during the formation of the electrodes.

On the other hand, the divided electrode cells of the third transmission photo detecting unit are aligned during assembly. For example, the same alignment mark is previously formed on the transparent substrates 150 and 190, and the adjustment is carried out on the basis of this mark during assembly.

In the triple-layer transmission photodetector 700 in this preferred embodiment, the wavelength bands of light beams detected by the three stacked photo detecting units are suitably formed so that the first wavelength band includes the shortest wavelength and the second and third wavelength bands include longer wavelengths in that order, since light beams of a longer wavelength has a large momentum to have a power so as to reach the inside of the photodetector. That is, light beams of the short wavelength band may be detected by the photodetector nearest to the plane of incidence.

The stacked type transmission photodetector 700 thus realized can be used for simply separating a color image into RGB to form an electronic image.

Figure 25:
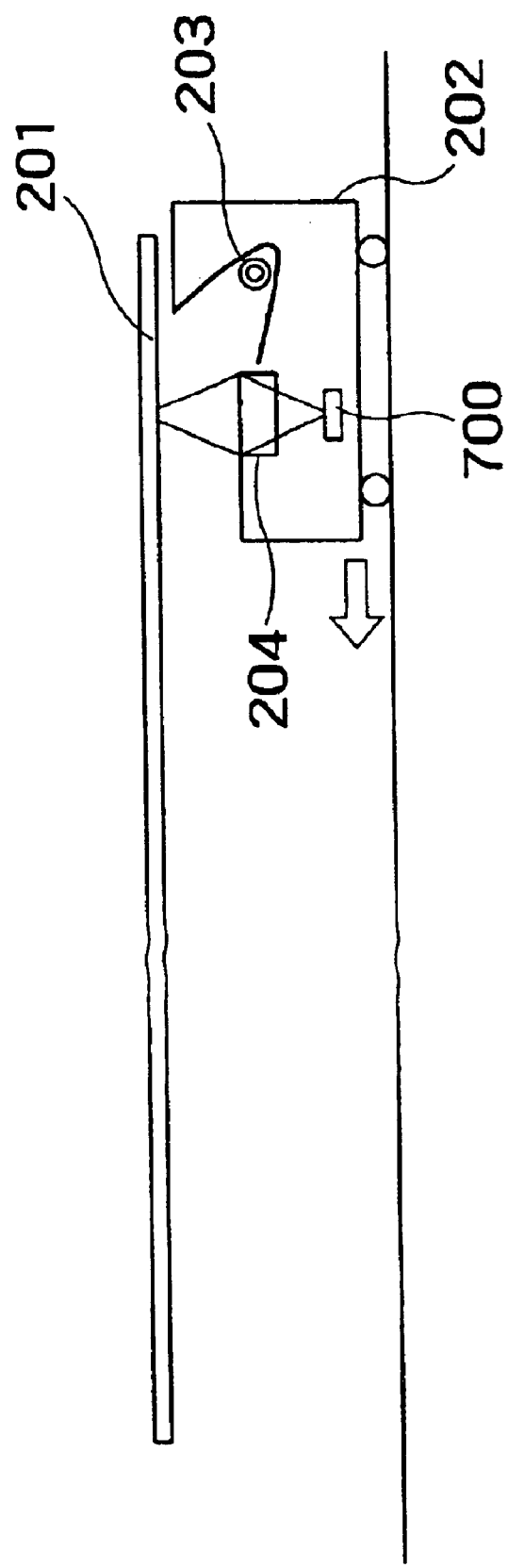
FIG. 25 is a conceptual drawing a preferred embodiment wherein a color image is read.

FIG. 25 is a conceptual drawing showing a preferred embodiment wherein a color image is read out.

This triple-layer transmission photodetector is set so that the sensitizing dye film of the first transmission photo detecting unit 110 absorbs blue components, the sensitizing dye film of the second transmission photo detecting unit 130 absorbs green components and the sensitizing dye film of the third transmission photo detecting unit 170 mainly absorbs red components. This setting may be the separation into three colors such as yellow (Y), magenta (M) and cyanogen (C) if short wavelength components and long wavelength components are separated so as to be first and third, respectively.

The operation of a reading system shown in FIG. 25 will be described below. A detecting optical system comprises a lamp 203, a lens 204 and a stacked type transmission photodetector, and is mounted on a movable body 202. An original surface 201 is irradiated with light beams emitted from the lamp, and only the linear return light beams are condensed on the stacked type transmission photodetector. By moving the movable body in parallel to the original surface, information on the original surface is sequentially collected by the photodetector. At this time, light beams reflected on the original surface include color information on the original surface to be incident on the stacked type transmission photodetector.

The incident light beams are first inputted to the first transmission photo detecting unit 110 of the stacked type transmission photodetector. At a place at which a photoelectric transfer is carried out by light beams absorbed into the first sensitizing dye film, a potential is generated in a corresponding divided electrode so that a current flows.

If an electrolyte is used as the buffer layer 65, a current continues to flow while light beams of the first wavelength band are absorbed. If the current-to-voltage conversion of this current is carried out, it can be extracted as voltage information.

On the other hand, if a dielectric is used as the buffer layer 65, a positive pulse current starts to flow simultaneously with the incidence of light beams of the corresponding first wavelength band on the first sensitizing dye film, and a negative pulse current flows when it is stopped. In this case, by a technique for detecting the generation of positive or negative pulse signals by means of a shift register circuit or a flip-flop circuit, it is possible to extract intensity information on light having a specific wavelength included in incident light. A concrete technique for use in an image sensor or the like will be briefly described. Condensers are provided so as to correspond to the respective electrode cells, so that the respective electrode cells are previously charged at a specific voltage. This voltage is periodically and sequentially charged. If discharge occurs for some reason, a voltage required for charge can be extracted as a signal. When a pulse current flows through one of the electrode cells of the photodetector, if the circuit is constructed so that a corresponding one of the condensers discharges in accordance with the current value, the value of the pulse signal can be detected as a discharged value when charge is periodically carried out.

As described above, the line irradiated with the lamp 203 is converted into color information and intensity information by means of the triple-layer stacked transmission photodetector in this preferred embodiment. While the movable body moves in parallel to the original, information on each of the cells is read out in synchronism therewith, so that information on the whole original can be read out.

Eighth Preferred Embodiment: Two-dimensional Image Sensor

FIG. 26(*a*) is a plan view showing the appearance of the eighth preferred embodiment of a stacked type transmission photodetector according to the present invention, and FIG. 26(*b*) is a sectional view of a principal part thereof.

The stacked type transmission photodetector in this preferred embodiment has a cell structure wherein the transparent electrode of the counter electrode part of the triple-layer stacked type transmission photodetector 700 in the seventh preferred embodiment is two-dimensionally symmetrically divided with respect to a point on the center of the optical axis of incident light. If this preferred embodiment is used as an image sensor, the matrix of the divided cells has a large scale of 600×480 or like.

The triple-layer stacked transmission photodetector in this preferred embodiment has the same construction as that in the seventh preferred embodiment, except for the dividing form of the electrode, so that the detailed descriptions thereof are omitted.

The triple-layer stacked transmission photodetector 800 formed as shown in FIG. 26 as an example can be used for simply separating a color image into RGB to form an electronic image.

Figure 27:
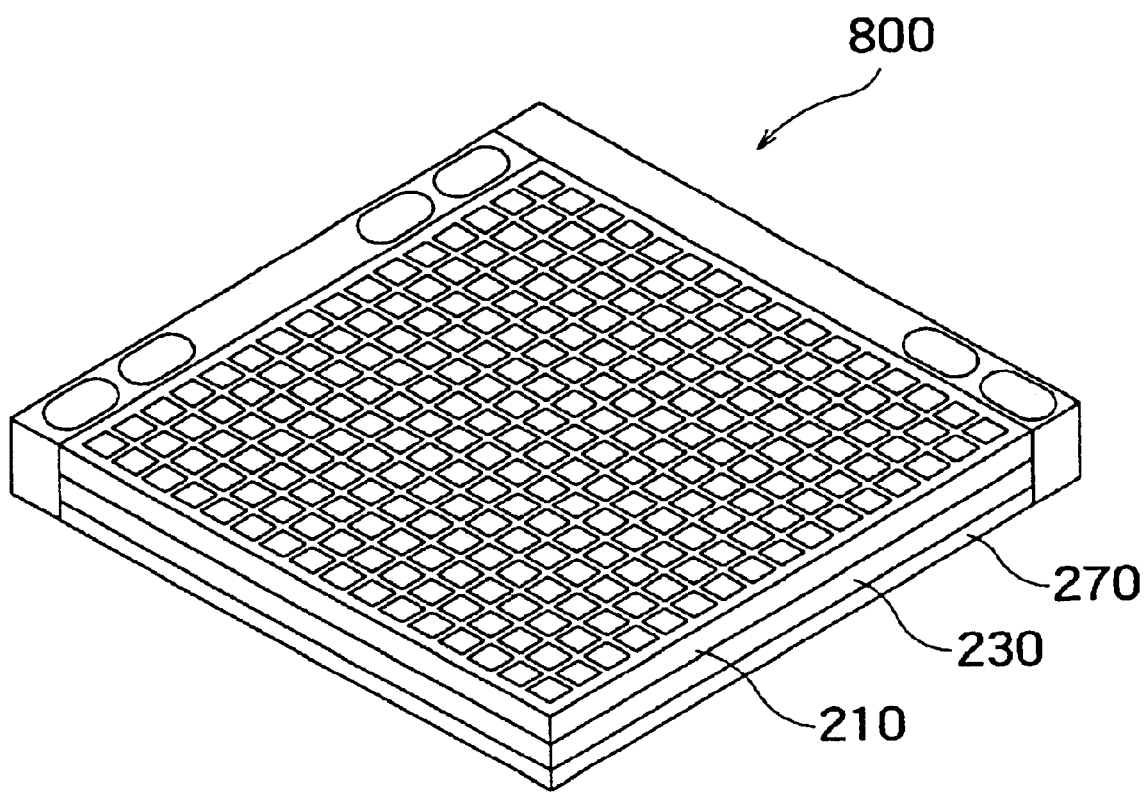
FIG. 27 is a conceptual drawing showing a construction wherein a color image is divided into RGB to form electronic images.
Figure 28:
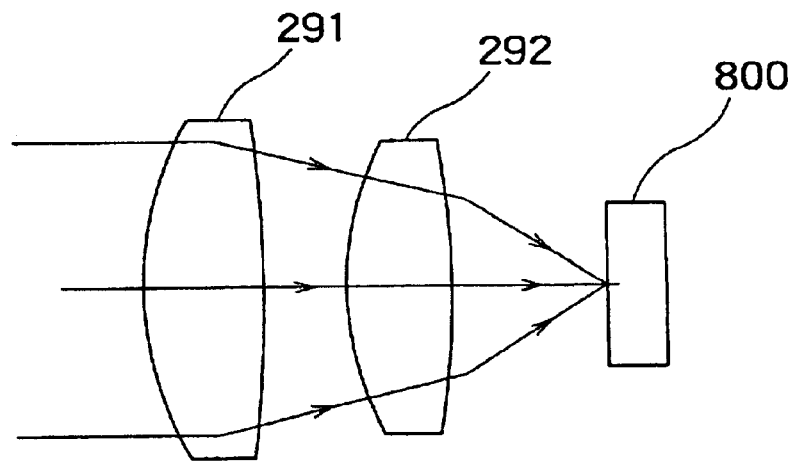
FIG. 28 is a conceptual drawing an example of an optical system.

FIG. 27 shows the appearance thereof, and FIG. 28 shows an example of an optical system thereof.

Figure 36:
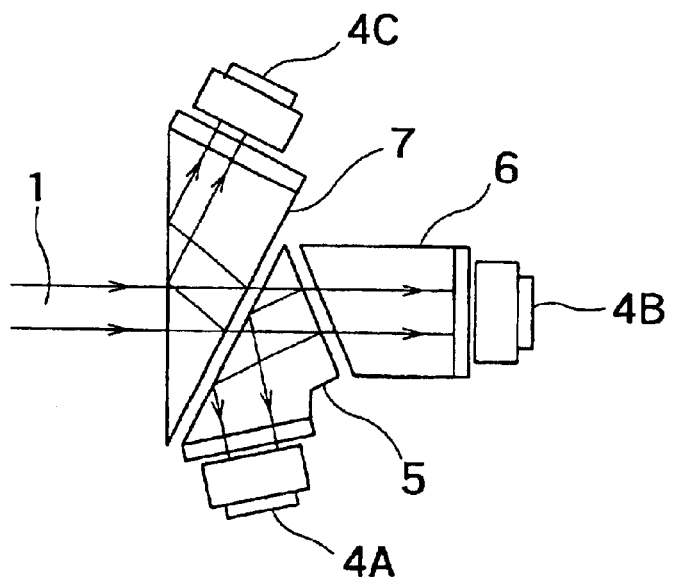
FIG. 36 is a conceptual drawing showing an optical system having three CCDS.
Figure 37:
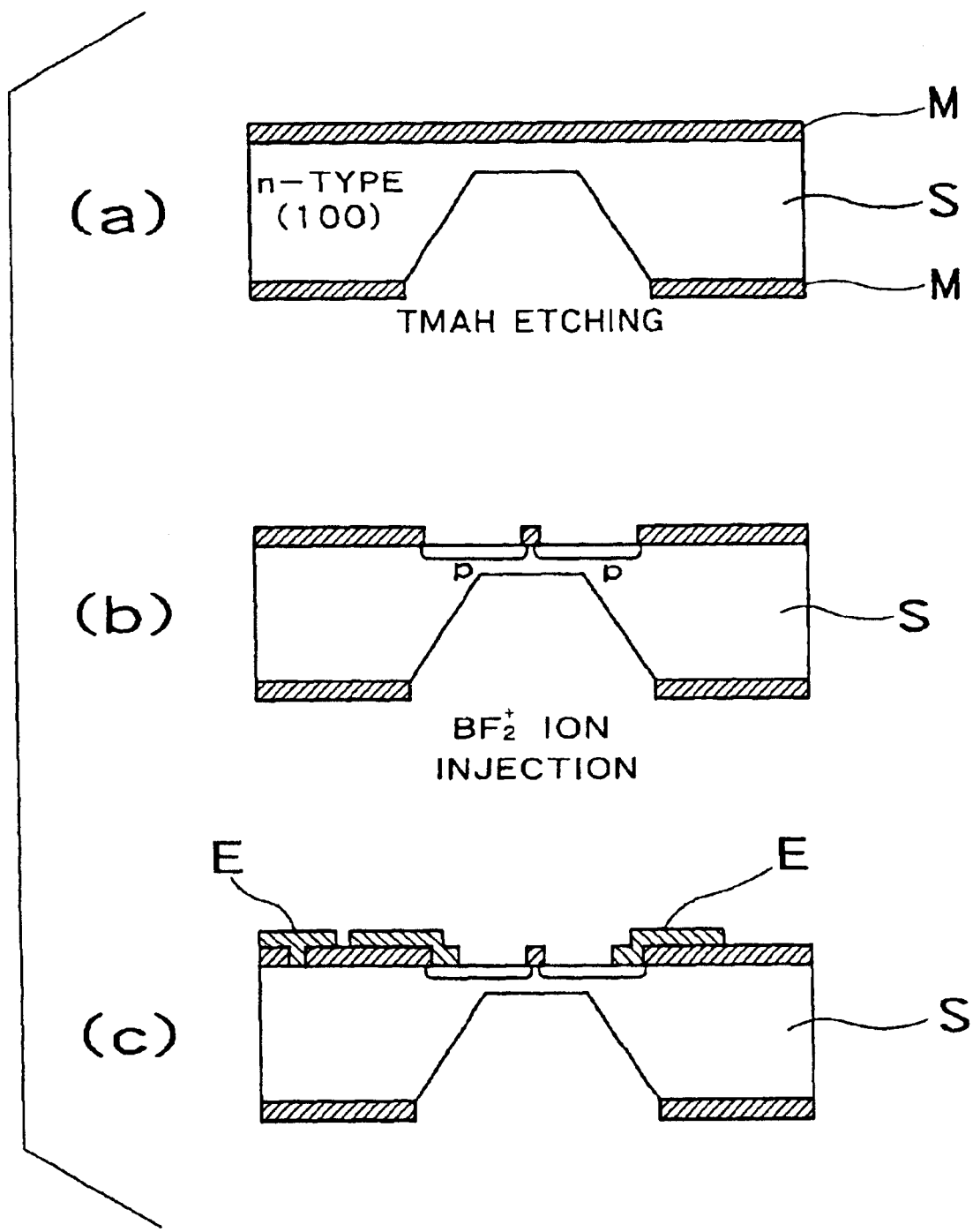
FIG. 37 is a sectional view showing a process for producing a thin-film photodiode using a process for controlled-thinning a silicon substrate.

That is, as shown in FIG. 28, the triple-layer stacked type transmission photodetector 800 in this preferred embodiment is arranged at the condensed position of condensing lenses 291 and 293. That is, the triple-layer stacked transmission photodetector in this preferred embodiment serves to be substituted for the three CCD detectors of the conventional video camera shown in FIG. 36, with a simple construction. Light beams including image information picked up as an object are condensed at the position of the photodetector 800 by means of the condensing lenses 291 and 292 to be detected as light intensity signals corresponding to the respective wavelength bands of blue, green and red by means of first, second and third transmission photo detecting units 210, 230 and 270, respectively. The plane distribution of these light intensity signals can be extracted as voltage values by means of the divided electrode cells, and the light intensity signals are inputted to a signal processing circuit to be processed as light intensity distribution signals corresponding to the respective wavelengths.

Although the above described construction is a typical construction in video cameras and so forth, it may be applied to other optical applied devices which have the same function.

Figure 29:
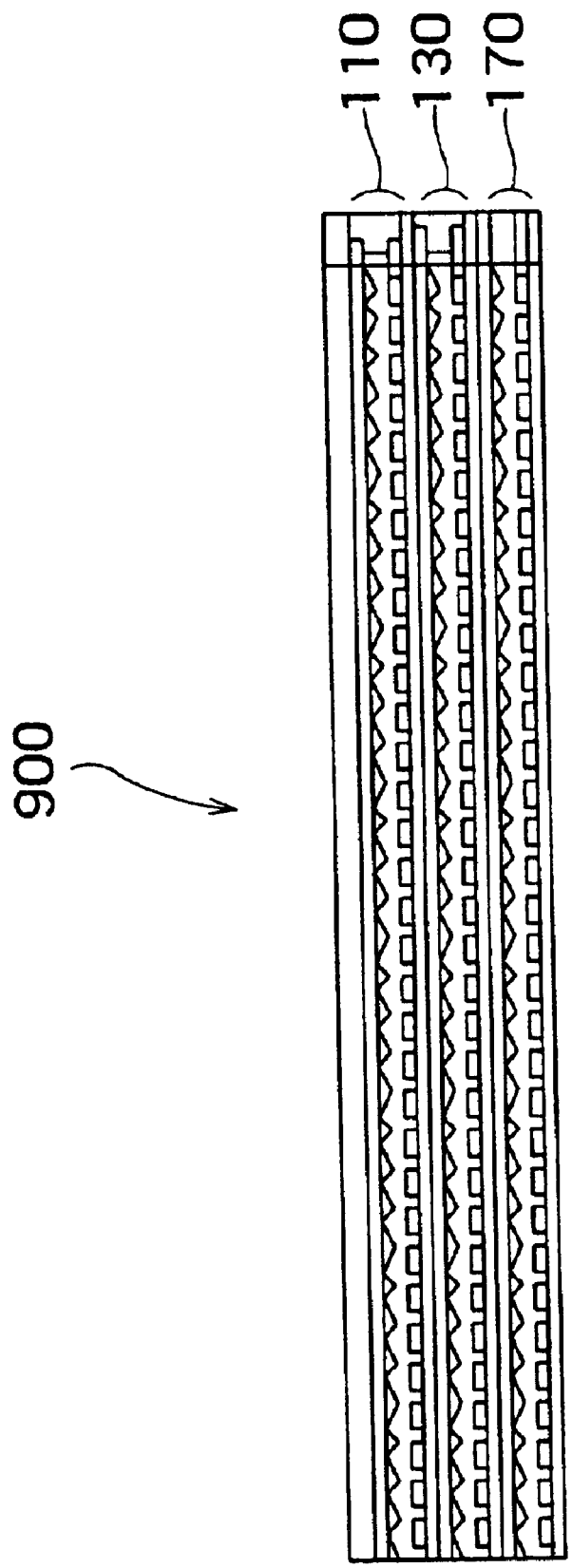
FIG. 29 is a conceptual drawing showing a photodetector wherein three transmission photo detecting units are aligned.

If it is more inexpensive to separately produce the respective transmission photo detecting units, each of the transmission photo detecting units may have a triple-layer stacked structure as shown in FIG. 29 as an example. That is, in FIG. 29, the photodetector 900 comprises three transmission photo detecting units 110, 130 and 170 which are aligned after being previously produced.

Ninth Preferred Embodiment: Input Unit Arranged Directly on Screen

The ninth preferred embodiment of the present invention will be described below.

Figure 30:
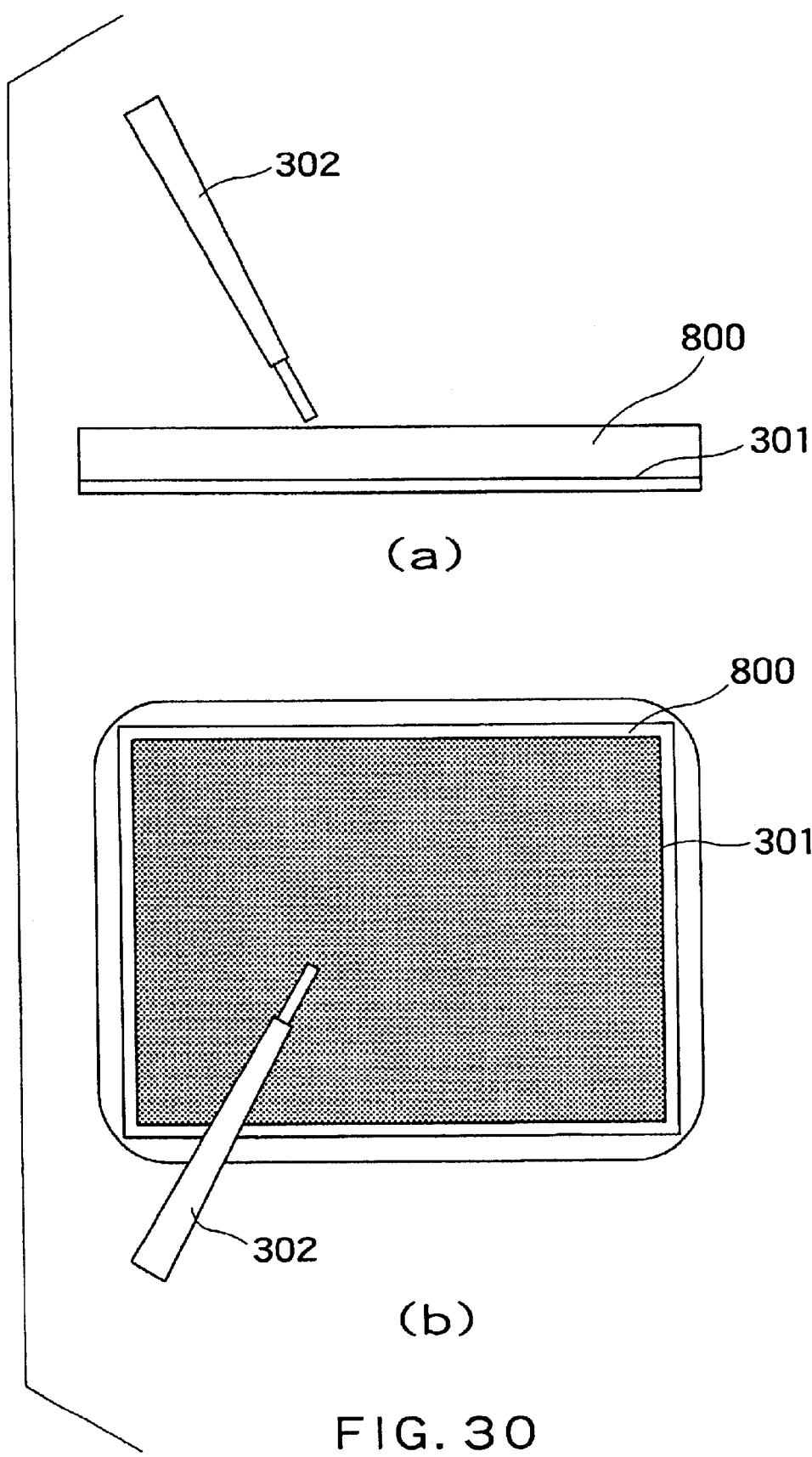
FIG. 30 is a conceptual drawing showing the construction of the ninth preferred embodiment of the present invention.

FIG. 30 is a conceptual drawing showing the construction of this preferred embodiment. FIG. 30(a) is a front view thereof, and FIG. 30(b) is a plan view thereof. That is, in this preferred embodiment, the triple-layer stacked transmission photodetector 800 according to the present invention is arranged on an original screen 301 to acquire image information on the original screen. However, the whole size and the size of each of pixels in the photodetector 800 for use in this preferred embodiment are different from those in the eighth preferred embodiment. That is, in this preferred embodiment, the photodetector 800 is formed so as to have a size corresponding to the size of the original to be incorporated.

The construction and operation in this preferred embodiment are substantially the same as those in the third preferred embodiment. That is, with the construction shown in FIG. 30, external light reflecting on the original surface 301 to return can be used for receiving information on the original surface to detect the information by means of the photodetector 300. In this case, if information on the original is color information, the triple-layer stacked transmission photodetector can be used as the photodetector to separately extract RGB information as signals.

The original surface may be image signals on an electronically projected display, or image information drawn on a paper.

By means of a pen-like input terminal 302 capable of outputting light beams of a specific wavelength, e.g., laser beams, it is possible to optionally write on the stacked type transmission photodetector according to the present invention to input information. In this case, although the transmission photodetector has a single layer, if a triple-layer stacked transmission photodetector is used, colors inputted by a pen can be separately distinguished by the wavelength of emitted laser beams.

Tenth Preferred Embodiment: Wavelength Measuring Apparatus

The tenth preferred embodiment of the present invention will be described below.

Figure 31:
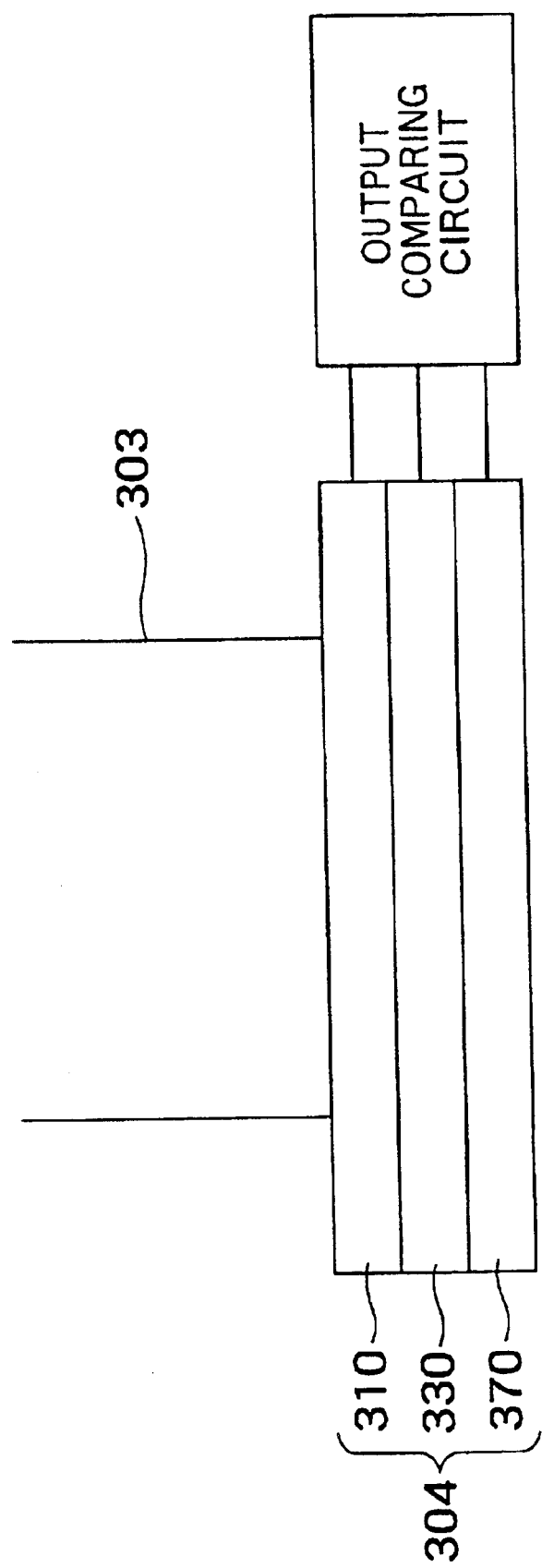
FIG. 31 is a conceptual drawing showing the construction of the tenth preferred embodiment of the present invention.

FIG. 31 is a conceptual drawing showing the construction of this preferred embodiment. That is, also in this preferred embodiment, a stacked type transmission photodetector 304 is used. This stacked type transmission photodetector 304 may have a structure wherein a plurality of transmission photo detecting units are stacked. FIG. 31 shows an example where three units 310, 330 and 370 are stacked. It is not always required to divide the electrodes of each of the transmission photo detecting units. The basic construction and operation of each of the transmission photo detecting units are the same as those in the above described preferred embodiments, so that the descriptions thereof are omitted.

In this preferred embodiment, incident light 303 is decomposed into three kinds of wavelength components by means of the stacked type transmission photodetector 304. In this case, if the signal outputs detected by the first transmission photo detecting unit 310, the second transmission photo detecting unit 330 and the third transmission photo detecting unit 370 are compared, it is possible to detect the ratios of the wavelength band components absorbed into the sensitizing dyes corresponding to the respective units. Thus, the spectra of the incident light 303 can be analyzed.

Eleventh Preferred Embodiment: Photodetector for Optical Disk Drive

The eleventh preferred embodiment of the present invention will be described below.

Figure 32:
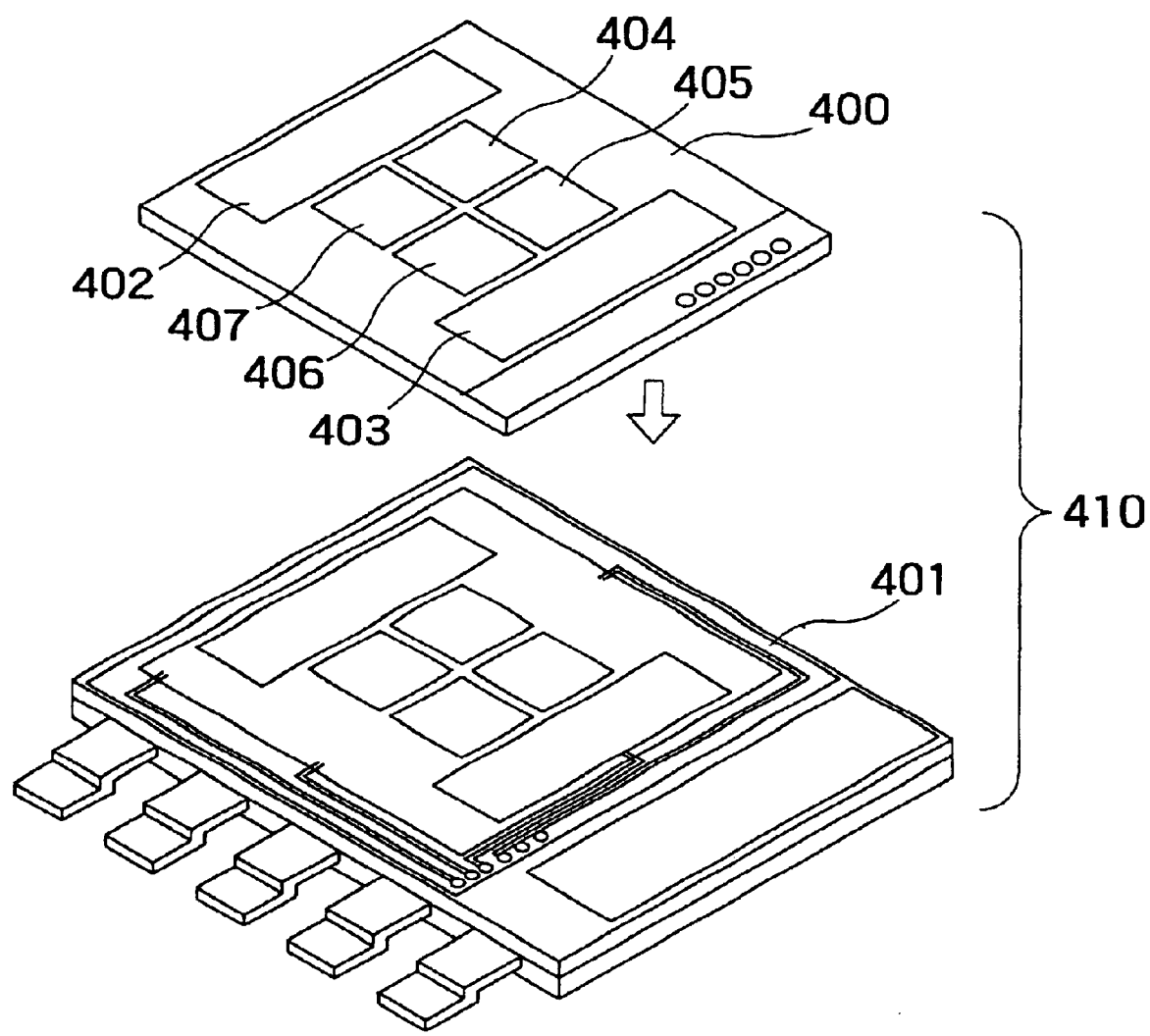
FIG. 32 is a conceptual drawing showing the construction of the eleventh preferred embodiment of the present invention.

FIG. 32 is a conceptual drawing showing the construction of this preferred embodiment. That is, this preferred embodiment is used in an optical applied device using light beams of a plurality of wavelengths, such as an optical disk reading system. In the shown embodiment, a transmission photodetector 400 is arranged on a typical photodetector 401 which does not transmit light, so that the photodetector 400 is formed as a stacked type photodetector 410.

With this construction, light in a wavelength band which can not be detected using only the conventional photodetector 401, particularly light of a short wavelength, can be detected by the transmission photodetector 400. The divided cells of the electrodes may be divided in accordance with the same pattern as or a different pattern from that of the photodetector. In this preferred embodiment, the electrode cells 402, 403, 404, 405, 406 and 407 are divided in accordance with the same pattern as that of the photodetector 401 as shown in the figure. For example, these electrode cells are adjusted so as to carry out a photoelectric transfer particularly in a wavelength band of about 400 nm.

Figure 33:
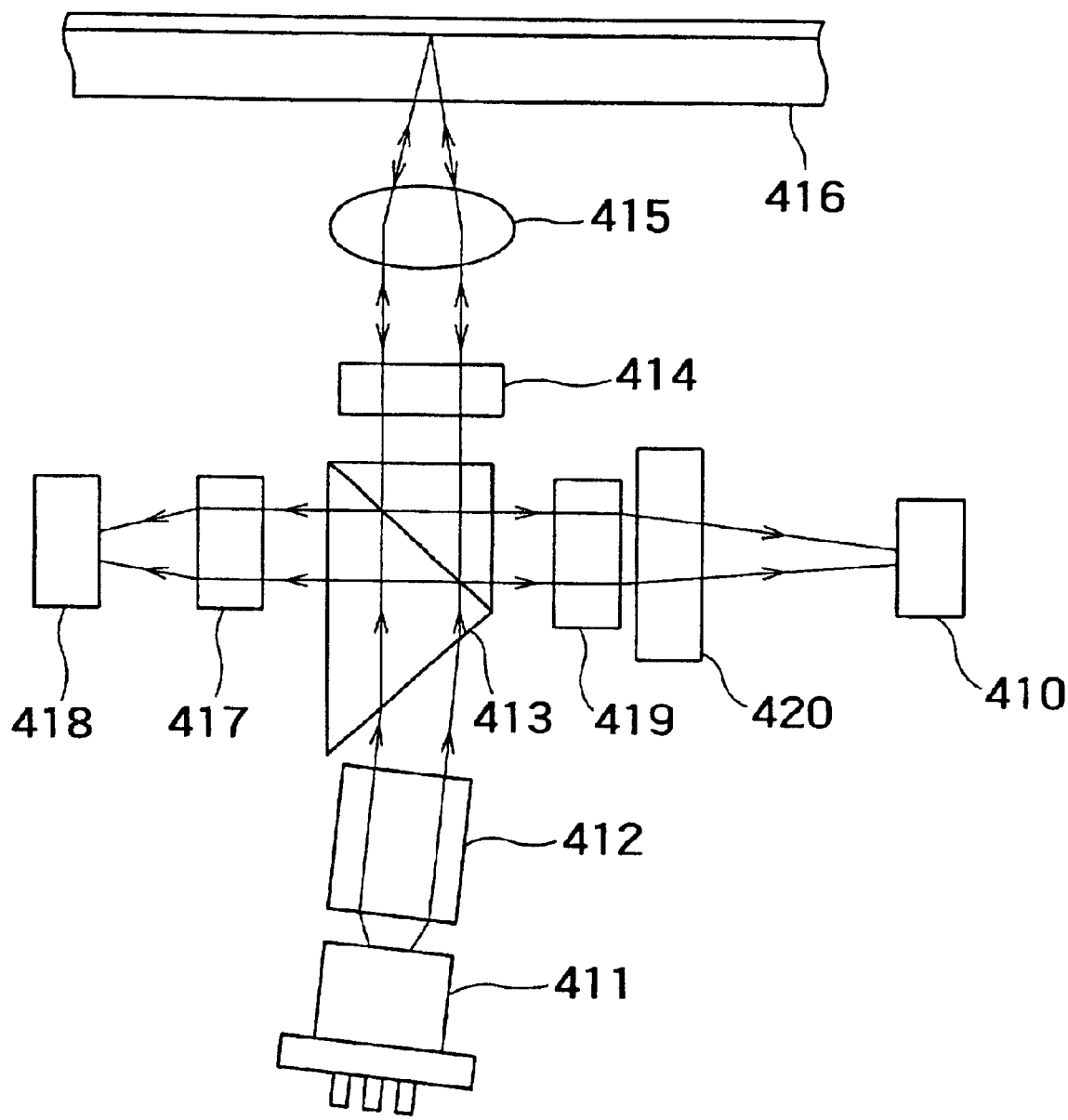
FIG. 33 is a conceptual drawing showing a detection system of an optical disc system.

The stacked type photodetector 410 is designed to detect signals with a simple detecting optical system with respect to laser beams of a plurality of wavelengths in the optical disc drive shown in FIG. 33 as an example. That is, laser beams emitted from a multi-wavelength laser 411 pass through a collimator lens 412, a prism 413 and a polarizing plate 414 to be condensed on the information recording surface of an optical disc 416 by means of an objective lens 415. At this time, part of laser beams are dispersed by the prism 413 to be condensed on a power monitor 418 by means of a lens 417 to control the power of the laser. On the other hand, light beams reflected on the information recording surface return to the prism 413 to enter a lens 419 to be incident on the photodetector 410 by means of a hologram element 420 or the like. The photodetector 410 detects signals for controlling the position of a spot which is condensed on the optical disc.

Twelfth Preferred Embodiment: Chromatic Aberration Recorder/Detector

The twelfth preferred embodiment of the present invention will be described below.

Figure 34:
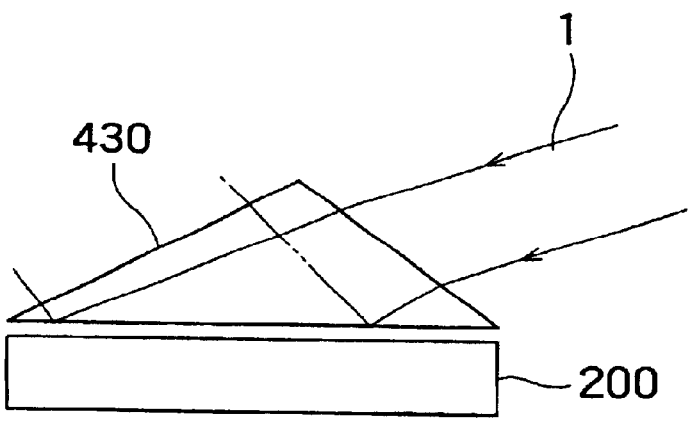
FIG. 34 is a conceptual drawing showing the construction of the twelfth preferred embodiment of the present invention.
Figure 35:
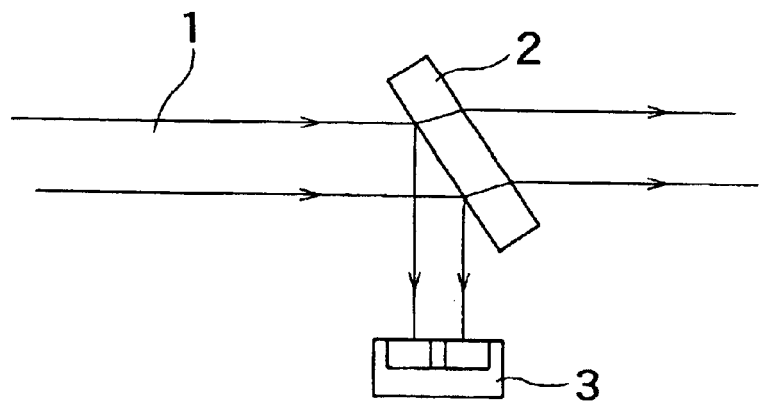
FIG. 35 is a conceptual drawing showing a construction wherein a detector is arranged at the end of an optical path.

FIG. 34 is a conceptual drawing showing the construction of this preferred embodiment. That is, as shown in this figure, the stacked type transmission photodetector 700 in the seventh preferred embodiment is arranged on the bottom face of a prism 430. With this construction, the chromatic aberration of incident light 1 can be detected in accordance with wavelength spectra, so that information on the incident light can be extracted.

While the present invention has been disclosed in terms of the preferred embodiment, the present invention should not be limited to the preferred embodiments.

For example, the structures and materials of the photodetectors in the above described preferred embodiments, and the constructions, arrangements and operations of the optical systems, peripheral circuits and driving systems in the applied examples thereof can be suitably selected from well known structures and so forth by persons skilled in the art to obtain the same advantages.

As described above, according to the present invention, it is possible to provide a transmission photodetector for transmitting light from both sides of its light receiving surface and for detecting light, so that it is possible to realize a compact detecting optical system by arranging the photodetector in an optical path.

In addition, according to the present invention, it is possible to provide an efficient photodetector capable of carrying out a photoelectric transfer also with respect to an intermediate region between divided regions. It is also possible to provide a photodetector wherein a portion to be divided may be only a second transparent electrode part and which can be easily formed by patterning or the like.

Moreover, it is possible to easily and surely carry out the detection of positions and the alignment of axes by suitably dividing the transparent electrode pattern.

It is also possible to easily and surely carry out the input of images, the pick-up of color images, the analysis of wavelengths by stacking the transmission photodetectors.

What is claimed is:

1. A transmission photodetector comprising:

a first transparent electrode;

a second transparent electrode, at least one of the first and second transparent electrodes being divided into a plurality of electrode cells; and a photoelectric transfer part sandwiched between the first and second transparent electrodes, the photoelectric transfer part being common to the plurality of electrode cells, wherein the first and second transparent electrodes, and the photoelectric transfer part are arranged in an optical path so that light transmitted in the optical path passes through the photodetector, and wherein the photodetector is configured to receive light from outside the photodetector directly on both a first surface of the first transparent electrode and a second surface of the second transparent electrode, wherein the photoelectric transfer part comprises an organic p-type semiconductor layer stacked on the first transparent electrode, and an organic n-type semiconductor layer stacked on the organic p-type semiconductor layer, and wherein the second transparent electrode is stacked on the organic n-type semiconductor layer.

2. A transmission photodetector comprising:

a first transparent electrode;

an organic p-type semiconductor layer stacked on the first transparent electrode;

an organic n-type semiconductor layer stacked on the organic p-type semiconductor layer; and a second transparent electrode stacked on the organic n-type semiconductor layer, wherein at least one of the first and second transparent electrodes is divided into a plurality of electrode cells, wherein the first transparent electrode, the organic p-type semiconductor layer, the organic n-type semiconductor layer, and the second transparent electrode are arranged in an optical path so that light transmitted in the optical path passes through the photodetector, and wherein the photodetector is configured to receive light from outside the photodetector directly on both a first surface of the first transparent electrode and a second surface of the second transparent electrode.

3. A stacked type photodetector comprising:

a first transmission photodetector configured to carry out a photoelectric transfer with respect to light in a first wavelength band including a predetermined wavelength; and a second photodetector, stacked on the first transmission photodetector, configured to detect light passing through the first transmission photodetector, wherein the first and second photodetectors are arranged in an optical path so that light transmitted in the optical path passes through the stacked type photodetector, and wherein the stacked type photodetector is configured to receive light from outside the stacked photodetector directly on both a first surface of the first transmission photodetector and a second surface of the second photodetector.

4. The stacked type photodetector according to claim 3, wherein the first transmission photodetector comprises:

a first transparent electrode;

a transparent semiconductor layer stacked on the first transparent electrode;

a sensitizing dye film stacked on the transparent semiconductor layer;

a second transparent electrode; and a carrier transporting layer sandwiched between the sensitizing dye film and the second transparent electrode.

5. The stacked type photodetector according to claim 3, wherein the first transmission photodetector comprises:

a first transparent electrode;

a transparent semiconductor layer stacked on the first transparent electrode;

a sensitizing dye film stacked on the transparent semiconductor layer;

a second transparent electrode; and a dielectric layer sandwiched between the sensitizing dye film and the second transparent electrode.

6. The stacked type photodetector according to claim 3, wherein the first transmission photodetector comprises:

a first transmission electrode;

an organic p-type semiconductor layer stacked on the first transparent electrode;

an organic n-type semiconductor layer stacked on the organic p-type semiconductor layer; and a second transparent electrode stacked on the organic n-type semiconductor layer.

7. The stacked type photodetector according to claim 4, wherein the second photodetector has a third transparent electrode, and at least one of the first or second transparent electrode of the first photodetector and the third transparent electrode of the second photodetector is divided into a plurality of electrode cells.

8. The stacked type photodetector according to claim 5, wherein the second photodetector has a third transparent electrode, and at least one of the first or second transparent electrode of the first photodetector and the third transparent electrode of the second photodetector is divided into a plurality of electrode cells.

9. The stacked type photodetector according to claim 6, wherein the second photodetector has a third transparent electrode, and at least one of the first or second transparent electrode of the first photodetector and the third transparent electrode of the second photodetector is divided into a plurality of electrode cells.

10. A stacked type photodetector comprising:

a first transmission photodetector configured to carry out a photoelectric transfer with respect to light in a first wavelength band including a predetermined wavelength;

a second photodetector configured to detect light passing through the first transmission photodetector; and a transparent substrate provided between the first and second photodetectors, the transparent substrate including two principal planes placed on opposite sides, wherein the first transmission photodetector comprises first and second transparent electrodes, the second transparent electrode being provided on one principal plane of the transparent substrate, and the second photodetector has a third transparent electrode provided on the other principal plane of the transparent substrate, wherein the first and second photodetectors are arranged in an optical path so that light transmitted in the optical path passes through the stacked type photodetector, and wherein the stacked type photodetector is configured to receive light from outside the stacked photodetector directly on both a first surface of the first transparent electrode and a second surface of the second photodetector.

11. The stacked type photodetector according to claim 10, wherein each of the second and third transparent electrodes is divided into a plurality of electrode cells, the plurality of electrode cells of the second transparent electrode being the same dividing pattern as those of the third transparent electrode.

12. The stacked type photodetector according to claim 11, wherein the plurality of electrode cells are disposed symmetrically with respect to a center on the optical axis of incident light.

13. The stacked type photodetector according to claim 10, wherein the second photodetector has a fourth transparent electrode provided so as to face the third transparent electrode, and each of the first and fourth transparent electrodes has a constant potential during operation.

14. The stacked type photodetector according to claim 11, further comprising a signal processor, integrally provided with the photodetector, configured to process an electric signal every one of the divided electrode cells, the electric signals being obtained from the first and second transmission photodetectors via each of the second and third transparent electrodes.

15. The stacked type photodetector according to claim 3, wherein a second wavelength band photoelectric-transferred by the second photodetector includes a longer wavelength component than that of the first wavelength band photoelectric-transferred by the first transmission photodetector.

16. The stacked type photodetector according to claim 4, wherein a second wavelength band photoelectric-transferred by the second photodetector includes a longer wavelength component than that of the first wavelength band photoelectric-transferred by the first transmission photodetector.

17. The stacked type photodetector according to claim 5, wherein a second wavelength band photoelectric-transferred by the second photodetector includes a longer wavelength component than that of the first wavelength band photo electric-transferred by the first transmission photodetector.

18. The stacked type photodetector according to claim 6, wherein a second wavelength band photoelectric-transferred by the second photodetector includes a longer wavelength component than that of the first wavelength band photoelectric-transferred by the first transmission photodetector.

* * * * *